United States Patent
Sampsell

(10) Patent No.: US 7,446,926 B2
(45) Date of Patent: Nov. 4, 2008

(54) SYSTEM AND METHOD OF PROVIDING A REGENERATING PROTECTIVE COATING IN A MEMS DEVICE

(75) Inventor: Jeffrey B. Sampsell, San Jose, CA (US)

(73) Assignee: IDC, LLC, Pleasanton, CA (US)

(*) Notice: Subject to any disclaimer, the term of this patent is extended or adjusted under 35 U.S.C. 154(b) by 400 days.

(21) Appl. No.: 11/134,028

(22) Filed: May 20, 2005

(65) Prior Publication Data

US 2006/0077150 A1    Apr. 13, 2006

Related U.S. Application Data

(60) Provisional application No. 60/613,564, filed on Sep. 27, 2004.

(51) Int. Cl.
G02B 26/00 (2006.01)

(52) U.S. Cl. .............. 359/290; 359/291; 359/298; 348/770; 348/771; 345/85; 345/108

(58) Field of Classification Search ......... 359/223–224, 359/290–295, 298; 348/770, 771; 345/85, 345/108
See application file for complete search history.

(56) References Cited

U.S. PATENT DOCUMENTS

| | | |
|---|---|---|
| 4,074,480 A | 2/1978 | Burton |
| 4,310,220 A | 1/1982 | Kuwagaki et al. |
| 4,459,182 A | 7/1984 | te Velde |
| 4,956,619 A | 9/1990 | Hornbeck |
| 5,018,256 A | 5/1991 | Hornbeck |
| 5,099,353 A | 3/1992 | Hornbeck |
| 5,216,537 A | 6/1993 | Hornbeck |
| 5,244,707 A | 9/1993 | Shores |
| 5,268,533 A | 12/1993 | Kovacs et al. |
| 5,331,454 A | 7/1994 | Hornbeck |
| 5,401,983 A | 3/1995 | Jokerst et al. |
| 5,411,769 A | 5/1995 | Hornbeck |
| 5,526,172 A | 6/1996 | Kanack |
| 5,610,438 A | 3/1997 | Wallace et al. |

(Continued)

FOREIGN PATENT DOCUMENTS

EP     0 667 548     8/1995

(Continued)

OTHER PUBLICATIONS

Ashurst, et al., Dichlorodimethylsilane as an Anti-Stiction Monolayer for MEMS: A Comparison to the Octadecyltrichlosilane Self-Assembled Monolayer, vol. 10, No. 1, Mar. 2001, pp. 41-49.

(Continued)

*Primary Examiner*—Evelyn A. Lester
(74) *Attorney, Agent, or Firm*—Knobbe Martens Olson & Bear LLP

(57) ABSTRACT

In various embodiments of the invention, a regenerating protective coating is formed on at least one surface of an interior cavity of a MEMS device. Particular embodiments provide a regenerating protective coating on one or more mirror surfaces of an interferometric light modulation device, also known as an iMoD in some embodiments. The protective coating can be regenerated through the addition of heat or energy to the protective coating.

31 Claims, 18 Drawing Sheets

U.S. PATENT DOCUMENTS

| | | | |
|---|---|---|---|
| 5,777,705 A | 7/1998 | Pierson et al. | |
| 5,784,189 A | 7/1998 | Bozler et al. | |
| 5,835,255 A | 11/1998 | Miles | |
| 5,853,662 A | 12/1998 | Watanabe | |
| 5,856,820 A | 1/1999 | Weigers et al. | |
| 5,875,011 A | 2/1999 | Pierson et al. | |
| 5,936,758 A | 8/1999 | Fisher et al. | |
| 5,939,785 A | 8/1999 | Klonis et al. | |
| 5,959,763 A | 9/1999 | Bozler et al. | |
| 6,040,937 A | 3/2000 | Miles | |
| 6,055,090 A | 4/2000 | Miles | |
| 6,107,115 A | 8/2000 | Atobe et al. | |
| 6,120,339 A | 9/2000 | Alwan | |
| 6,127,765 A | 10/2000 | Fushinobu | |
| 6,195,196 B1 | 2/2001 | Kimura et al. | |
| 6,238,755 B1 | 5/2001 | Harvey et al. | |
| 6,262,696 B1 | 7/2001 | Seraphim et al. | |
| 6,303,986 B1 | 10/2001 | Shook | |
| 6,335,255 B1 | 1/2002 | Evaldsson et al. | |
| 6,365,229 B1 * | 4/2002 | Robbins | 427/248.1 |
| 6,379,988 B1 | 4/2002 | Peterson et al. | |
| 6,426,461 B1 | 7/2002 | Ginter et al. | |
| 6,447,126 B1 | 9/2002 | Hornbeck | |
| 6,455,927 B1 | 9/2002 | Glenn et al. | |
| 6,462,392 B1 | 10/2002 | Pinter et al. | |
| 6,465,355 B1 | 10/2002 | Horsley | |
| 6,466,354 B1 | 10/2002 | Gudeman | |
| 6,489,670 B1 | 12/2002 | Peterson et al. | |
| 6,495,895 B1 | 12/2002 | Peterson et al. | |
| 6,525,416 B2 | 2/2003 | Hauser et al. | |
| 6,538,312 B1 | 3/2003 | Peterson et al. | |
| 6,558,820 B2 | 5/2003 | Raychaudhuri et al. | |
| 6,589,625 B1 | 7/2003 | Kothari et al. | |
| 6,603,182 B1 | 8/2003 | Low et al. | |
| 6,650,455 B2 | 11/2003 | Miles | |
| 6,661,084 B1 | 12/2003 | Perterson et al. | |
| 6,674,159 B1 | 1/2004 | Peterson et al. | |
| 6,674,562 B1 | 1/2004 | Miles | |
| 6,680,792 B2 | 1/2004 | Miles | |
| 6,690,444 B1 | 2/2004 | Wilkinson et al. | |
| 6,747,800 B1 | 6/2004 | Lin | |
| 6,779,260 B1 | 8/2004 | Brandenburg et al. | |
| 6,843,936 B1 | 1/2005 | Jacobs | |
| 6,867,896 B2 | 3/2005 | Miles | |
| 6,870,654 B2 | 3/2005 | Lin et al. | |
| 6,882,458 B2 | 4/2005 | Lin et al. | |
| 6,882,461 B1 | 4/2005 | Tsai et al. | |
| 6,882,480 B2 | 4/2005 | Yanagisawa | |
| 6,912,022 B2 | 6/2005 | Lin et al. | |
| 6,947,200 B2 | 9/2005 | Huibers | |
| 6,952,303 B2 | 10/2005 | Lin et al. | |
| 6,958,847 B2 | 10/2005 | Lin | |
| 6,995,890 B2 | 2/2006 | Lin | |
| 6,999,225 B2 | 2/2006 | Lin et al. | |
| 7,015,885 B2 | 3/2006 | Novotny et al. | |
| 7,034,984 B2 | 4/2006 | Pan et al. | |
| 7,060,895 B2 | 6/2006 | Kothari et al. | |
| 7,123,216 B1 | 10/2006 | Miles | |
| 7,126,741 B2 | 10/2006 | Wagner et al. | |
| 7,161,728 B2 | 1/2007 | Sampsell et al. | |
| 7,164,520 B2 | 1/2007 | Palmateer et al. | |
| 2001/0055146 A1 | 12/2001 | Atobe et al. | |
| 2002/0015215 A1 | 2/2002 | Miles | |
| 2002/0024711 A1 | 2/2002 | Miles | |
| 2002/0043706 A1 | 4/2002 | Jerominek et al. | |
| 2002/0056900 A1 | 5/2002 | Liu et al. | |
| 2002/0070931 A1 | 6/2002 | Ishikawa | |
| 2002/0075551 A1 | 6/2002 | Daneman | |
| 2002/0126364 A1 | 9/2002 | Miles | |
| 2002/0160583 A1 | 10/2002 | Song | |
| 2002/0187254 A1 | 12/2002 | Ghosh | |
| 2003/0020094 A1 | 1/2003 | Shrauger | |
| 2003/0043157 A1 | 3/2003 | Miles | |
| 2003/0054588 A1 | 3/2003 | Patel et al. | |
| 2003/0062186 A1 | 4/2003 | Boroson et al. | |
| 2003/0072070 A1 | 4/2003 | Miles | |
| 2003/0075794 A1 | 4/2003 | Felton et al. | |
| 2003/0108306 A1 | 6/2003 | Whitney et al. | |
| 2003/0144034 A1 | 7/2003 | Hack et al. | |
| 2003/0152872 A1 | 8/2003 | Miles | |
| 2003/0155643 A1 | 8/2003 | Freidhoff | |
| 2003/0183916 A1 | 10/2003 | Heck et al. | |
| 2003/0184412 A1 | 10/2003 | Gorrell | |
| 2004/0037956 A1 | 2/2004 | Yang | |
| 2004/0051929 A1 | 3/2004 | Sampsell et al. | |
| 2004/0061492 A1 | 4/2004 | Lopes et al. | |
| 2004/0076008 A1 | 4/2004 | Ikeda | |
| 2004/0100677 A1 | 5/2004 | Huibers et al. | |
| 2004/0125281 A1 | 7/2004 | Lin et al. | |
| 2004/0140557 A1 | 7/2004 | Sun et al. | |
| 2004/0145811 A1 | 7/2004 | Lin et al. | |
| 2004/0147198 A1 | 7/2004 | Lin et al. | |
| 2004/0163472 A1 | 8/2004 | Nagahara | |
| 2004/0173886 A1 | 9/2004 | Carley | |
| 2004/0175577 A1 | 9/2004 | Lin et al. | |
| 2004/0183990 A1 | 9/2004 | Guang et al. | |
| 2004/0184133 A1 | 9/2004 | Su et al. | |
| 2004/0207897 A1 | 10/2004 | Lin | |
| 2004/0209192 A1 | 10/2004 | Lin et al. | |
| 2004/0209195 A1 | 10/2004 | Lin | |
| 2004/0218251 A1 | 11/2004 | Piehl et al. | |
| 2005/0003667 A1 | 1/2005 | Lin et al. | |
| 2005/0024557 A1 | 2/2005 | Lin | |
| 2005/0035699 A1 | 2/2005 | Tsai | |
| 2005/0036095 A1 | 2/2005 | Yeh et al. | |
| 2005/0036192 A1 | 2/2005 | Lin et al. | |
| 2005/0042117 A1 | 2/2005 | Lin | |
| 2005/0046919 A1 | 3/2005 | Taguchi et al. | |
| 2005/0046922 A1 | 3/2005 | Lin et al. | |
| 2005/0046948 A1 | 3/2005 | Lin | |
| 2005/0068605 A1 | 3/2005 | Tsai | |
| 2005/0068606 A1 | 3/2005 | Tsai | |
| 2005/0074919 A1 | 4/2005 | Patel et al. | |
| 2005/0078348 A1 | 4/2005 | Lin | |
| 2005/0093134 A1 | 5/2005 | Tam | |
| 2005/0168849 A1 | 8/2005 | Lin | |
| 2005/0184304 A1 | 8/2005 | Gupta et al. | |
| 2005/0195462 A1 | 9/2005 | Lin | |
| 2005/0202649 A1 | 9/2005 | Hung et al. | |
| 2005/0253283 A1 | 11/2005 | Dcamp et al. | |
| 2005/0254982 A1 | 11/2005 | Cadeddu | |
| 2006/0029732 A1 * | 2/2006 | Kobrin et al. | 427/248.1 |
| 2006/0066935 A1 | 3/2006 | Cummings et al. | |
| 2006/0148365 A1 | 7/2006 | Tsai | |
| 2006/0274400 A1 | 12/2006 | Miles | |
| 2007/0170568 A1 | 7/2007 | Palmateer et al. | |

FOREIGN PATENT DOCUMENTS

| | | |
|---|---|---|
| EP | 0 822 570 | 2/1998 |
| EP | 1418154 A2 | 5/2004 |
| GB | 2408620 A | 6/2005 |
| JP | 02-068513 | 3/1990 |
| JP | 03-199920 | 8/1991 |
| JP | 2001-318324 | 11/2001 |
| JP | 2002-062491 | 2/2002 |
| JP | 2002-328313 | 11/2002 |
| JP | 2003-233024 | 8/2003 |
| WO | WO 95/01624 | 1/1995 |
| WO | WO 99/41732 | 8/1999 |
| WO | WO 01/58804 | 8/2001 |
| WO | WO 02/42716 A2 | 5/2002 |
| WO | WO 03/026369 A1 | 3/2003 |
| WO | WO 03/054925 | 3/2003 |

| | | |
|---|---|---|
| WO | WO 03/084861 | 10/2003 |
| WO | WO 2005/066596 | 7/2005 |

OTHER PUBLICATIONS

U.S. Appl. No. 11/048,662, filed Jan. 27, 2005, Cummings et al.
U.S. Appl. No. 11/119,433, filed Apr. 29, 2005, Palmateer et al.
Aratani K., et al., "Surface micromachined tuneable interferometer array," Sensors and Actuators, pp. 17-23. (1994).
Ashurst, R.W., et al. "Vapor-Phase Anti-Stiction Coatings for MEMS" IEEE transactions o Device and materials reliability vol. 3, No. 4 Dec. 2003, pp. 173-178.
Liang, Zhi-Hao et al., "A Low Temperature Wafer-Level Hermetic MEMS Package Using UV Curable Adhesive", Electronic Components and Technology Conference, 2004 IEEE, pp. 1486-1491.
Maboudian, R., et al. "Self-Assembled Monolayers as Anti-stiction coatings for MEMS: characteristics and recent developments" Sensors and Actuators 82, (2000) pp. 219-223.
European Search Report for EP application No. 05255675.0.
European Search Report for EP application No. 05255679.
Greco et al., Optical properties of IPN-like networks polyethylene/poly(butylmethacrylate-co-styrene copolymer systems, III. Influence of copolymer crosslinkers, Polymer 42 (2001), 5089-5095.
European Search Report for App. No. EP 05255700.6.
European Search Report for App. No. EP 05255684.2.
Moraja, et al., Advanced Getter Solutions at Wafer Level to Assure High Reliability to the last Generations MEMS, IEEE Reliability Physics Symposium Proceedings, 2003, pp. 458-459.
Sparks, et al. Chip-Level Vacuum Packaging of Micromachines Using NanoGetters, IEEE Transactions on Advanced Packaging, vol. 26 Issue 3, Aug. 2003, pp. 277-282.
Extended European Search Report for European Application No. 05255681.8, dated Mar. 14, 2008.
Miles, Mark W. "MEMS based interferometric modulator for display applications" SPIE vol. 3876, Sep. 1999, p. 20-28.
Stark et al. "An integrated process for post-packaging release and vacuum sealing of electroplated nickel packages" Transducers '03; The 12th International Conference on Solid State Sensors, Actuators and Microsystems, Boston, Jun. 8-12, 2003.

* cited by examiner

SYSTEM AND METHOD OF PROVIDING A REGENERATING PROTECTIVE COATING IN A MEMS DEVICE

RELATED APPLICATIONS

This application claims priority under 35 U.S.C. § 119(e) to U.S. Provisional Application No. 60/613,564, filed on Sep. 27, 2004, which is hereby incorporated by reference in its entirety.

BACKGROUND

1. Field of the Invention

The field of the invention relates to microelectromechanical systems (MEMS). In particular, the invention relates to devices and methods for regenerating protective coatings in an interferometric modulator.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

Interferometric modulators can work by changing the distance between the two elements or layers, which can be achieved by moving one layer closer to the other. Movement of the two layers, as well as contact between the two layers, may result in deterioration of the surface of the two layers, leading to possibly undesirable operational characteristics.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One aspect of the invention is a system and method of regenerating a protective coating on a MEMS device. The method comprises periodically elevating the temperature of a protection layer, such as a self-aligned monolayer, on the MEMS device such that the protection layer is redistributed substantially uniformly over the desired surface of the MEMS device.

In some aspects, the invention is an interferometric light modulating device that comprises a transparent substrate; an interferometric modulator array disposed on the transparent substrate, the array comprises a transmissive layer and a reflective layer; a protective coating disposed between at least a portion of the transmissive layer and the reflective layer; and a heater configured to increase the temperature of the protective coating.

In some embodiments, the transparent substrate is sealed to a backplate to form a package so that the interferometric modulator array is located within the package. In some embodiments, the protective coating comprises a self-aligning monolayer. In some embodiments, the self-aligning monolayer comprises one of the following: polytetrafluoroethylene (PTFE), perfluorodecanoic carboxylic acid, octadecyltrichlorosilane (OTS), or dichlorodimethylsilane. In some embodiments, there is at least at least one hole in the package. In some embodiments, there is also a reservoir of a protective coating material that is not on the transmissive layer or the reflective layer; the reservoir of the protective coating material can serve as a source for additional protective coating in the package during a regeneration procedure. In some embodiments, the protective coating is provided on at least a portion of the transmissive layer. In some embodiments, the protective coating is provided on at least a portion of the reflective layer. In some embodiments, the heater is contained within the package. In some embodiments, the heater comprises a metal layer on a surface within the package. In some embodiments, the metal layer is part of a circuit that is dedicated to create heat. In some embodiments, the metal in the metal layer comprises chrome or nickel. In some embodiments, the heater comprises a looped lead involving the transmissive layer, and the looped lead is shorted to ground potential. In such an embodiment, the looped lead can be configured to be switchably shorted to ground potential. In some embodiments, a micro-electro-mechanical-system (MEMS) is used to make the looped lead switchable. In some embodiments, the heater comprises a looped lead involving a mechanical layer that is associated with the reflective layer; the looped lead can be shorted to ground potential. In some embodiments, a current limiting resistor is included between a lead and a ground. In some embodiments, the heating element is positioned on a post in the package. In some embodiments, the heater is in about a same plane as that of the reflective layer in an undriven state. In some embodiments, the heater on the post is positioned above the reflective layer and above the substrate. In some embodiments, the heater is a bus structure that is positioned on top of a support and above a reflective layer.

In some aspects, the invention is a system for regenerating a self-aligned monolayer formed on one or more layers of a micro-electronic-mechanical-system (MEMS) device. The system comprises a MEMS device that comprises a transmissive layer, a reflective layer, and a self-aligned monolayer, and a heater positioned proximal to the MEMS device. The heat emitted from the heater is sufficient to elevate the temperature of a self-aligned monolayer.

In some aspects, the invention is a method of regenerating a monolayer in a MEMS device. The method comprises providing a MEMS device that comprises an interferometric modulator and a heater. The interferometric modulator comprises a monolayer. The method further comprises activating the heater in order to increase the temperature of the monolayer, thereby regenerating the monolayer.

In some aspects, the invention is a system for regenerating a protective coating on an interferometric modulator device. The system comprises an interferometric modulator device that comprises a means for selectively allowing certain wavelengths of light to pass through a first layer, a means for selectively reflecting certain wavelengths of light, and a protective coating; and a means for heating the protective coating.

In some aspects, the invention is an interferometric modulator device with a protective coating that has been regenerated on either a transmissive layer or a reflective layer of the interferometric modulator device at least once.

In some aspects, the invention is a method of making a system for regenerating a self-aligned monolayer formed on one or more layers of a micro-electronic-mechanical-system (MEMS) device. The method comprises providing a MEMS device that comprises a transmissive layer, a reflective layer, and a self-aligned monolayer, and positioning a heater proximal to the MEMS device so that heat emitted from said heater is sufficient to elevate the temperature of a self-aligned monolayer.

BRIEF DESCRIPTION OF THE DRAWINGS

FIG. 21B is a plan-view illustrating a heater grid where the heating elements are located in the same plane as the secondary conductor.

DETAILED DESCRIPTION OF CERTAIN EMBODIMENTS

Figure 1:
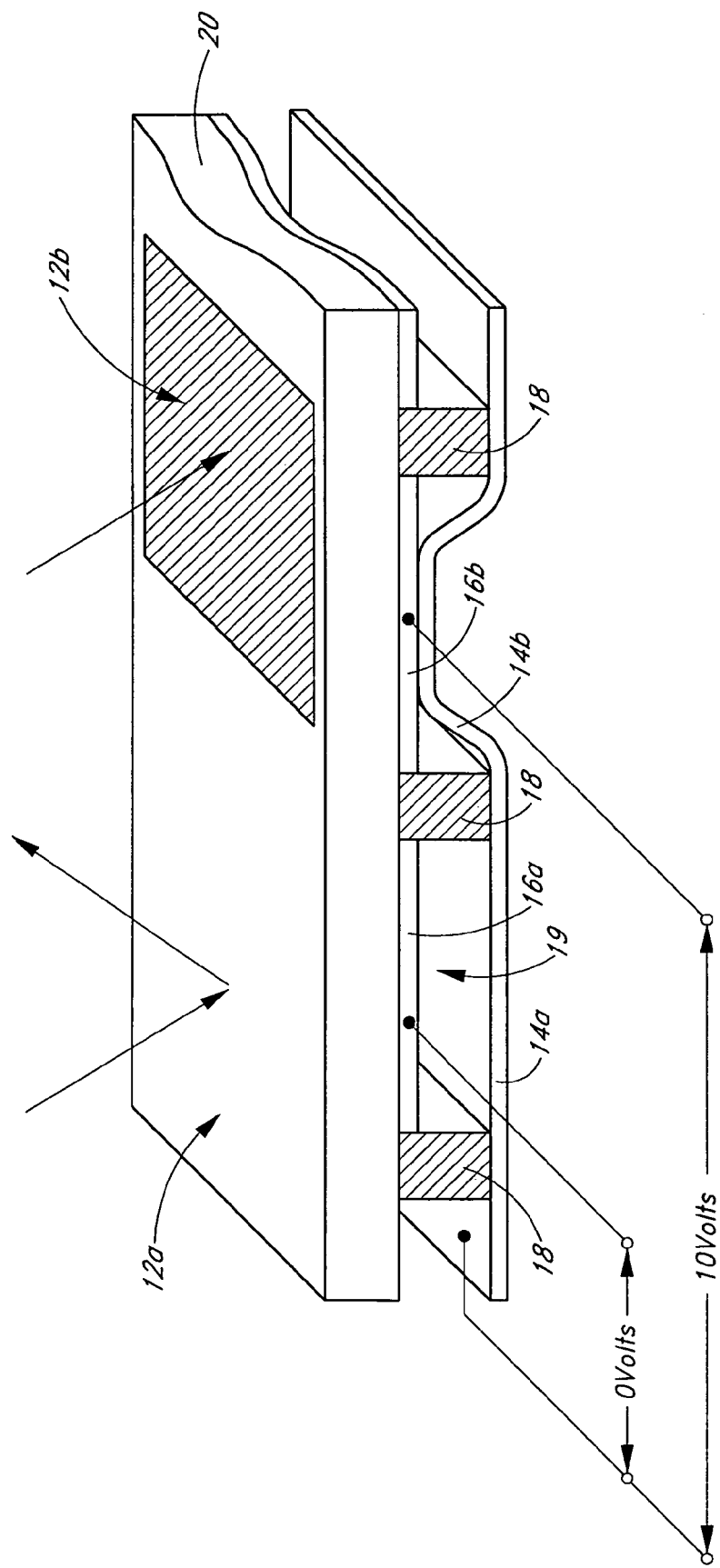
FIG. 1 is an isometric view depicting a portion of one embodiment of an interferometric modulator display in which a movable reflective layer of a first interferometric modulator is in a released position and a movable reflective layer of a second interferometric modulator is in an actuated position.

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One embodiment of the invention relates to a method and device for regenerating a protective coating that has been deposited on elements or layers of an interferometric modulator device. In some embodiments, the protective coating is heated in order to regenerate the protective coating. Heat can be applied to an area of the device that comprises the protective coating in order to regenerate the protective coating across a surface of the elements or layers. Thus, in one embodiment, heat is used to redistribute the material that makes up the protective coating over a surface of an interferometric modulator element or layer. This process allows for gaps in the protective coating to be repaired as the heated protective coating fills in such gaps and then cools and becomes a solid layer. As will be appreciated by one of skill in the art, the heat source, heating device, or heater can be external or internal to a package that can contain the interferometric modulator.

As mentioned above, repeated use of an interferometric device can lead to damage of the various layers of the reflective and transmissive elements or layers. This can be due to flexure of the elements or repeated contact between the elements. In order to reduce damage that may occur through this break down, a protective coating can be deposited over the transmissive or reflective elements in order to reduce wear and tear. The protective coating can be, for example, on a conductor layer or an insulating layer of the device. Additionally, this protective coating can have other functions, such as being an anti-stiction coating which prevents elements from sticking together. While the protective coatings can protect what they are covering, they too can experience damage during use. As such, methods and compositions for regenerating the protective coatings are provided.

In some embodiments, the heater that increases the temperature of the protective coating is a resistive heater that can be contained within a sealed interferometric modulator device. In some embodiments the heater is a heating element or filament that is placed within a display device, for example on a substrate. In other embodiments, other circuits or wiring elements of the interferometric modulator device are used to generate heat, for example by shorting a looped lead of one of the reflective or transmissive elements, thereby turning the element into a heater. For example, the looped lead can include materials with sufficient resistive properties that are used in a transmissive layer, or a mechanical layer.

In other embodiments, the heater is placed on one or more posts in the interferometric modulator device so that the heater is elevated above the substrate and positioned closer to the reflective element. In some embodiments, the heater is in the same plane as the reflective element. In other embodiments, the heater is placed above the reflective element and the substrate. In some embodiments, the heater substantially covers or overlaps a surface of the reflective element.

In some embodiments, there is a reservoir of the protective coating material stored within the device. In this embodiment, when the regenerative process begins, the reservoir of material can be used to more efficiently lay down a reconstituted protective coating. In one embodiment, the protective coating is a monolayer.

In other aspects, a method for regenerating a protective coating in an interferometric modulator device is provided. The method involves using a protective coating with a component whose state is temperature sensitive and elevating the temperature of the interferometric modulator device to allow the component to redistribute itself across the desired surface.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers (also referred to as a reflective and transmissive layer) positioned at a variable and controllable distance from each other to form a resonant optical cavity with at least one variable dimension. In one embodiment, one of the reflective layers may be moved between two positions. In the first position, referred to herein as the relaxed, the movable layer is positioned at a relatively large distance from a fixed transmissive layer. In the second position, the movable layer is positioned more closely adjacent to the transmissive layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and reflective layer 14a is illustrated in a relaxed position at a predetermined distance from a fixed transmissive layer 16a. In the interferometric modulator 12b on the right, the movable reflective (or "highly reflective") layer 14b is illustrated in an actuated position adjacent to the fixed transmissive (or "partially reflective") layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers 14a, 14b are separated from the fixed metal layers by a defined gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
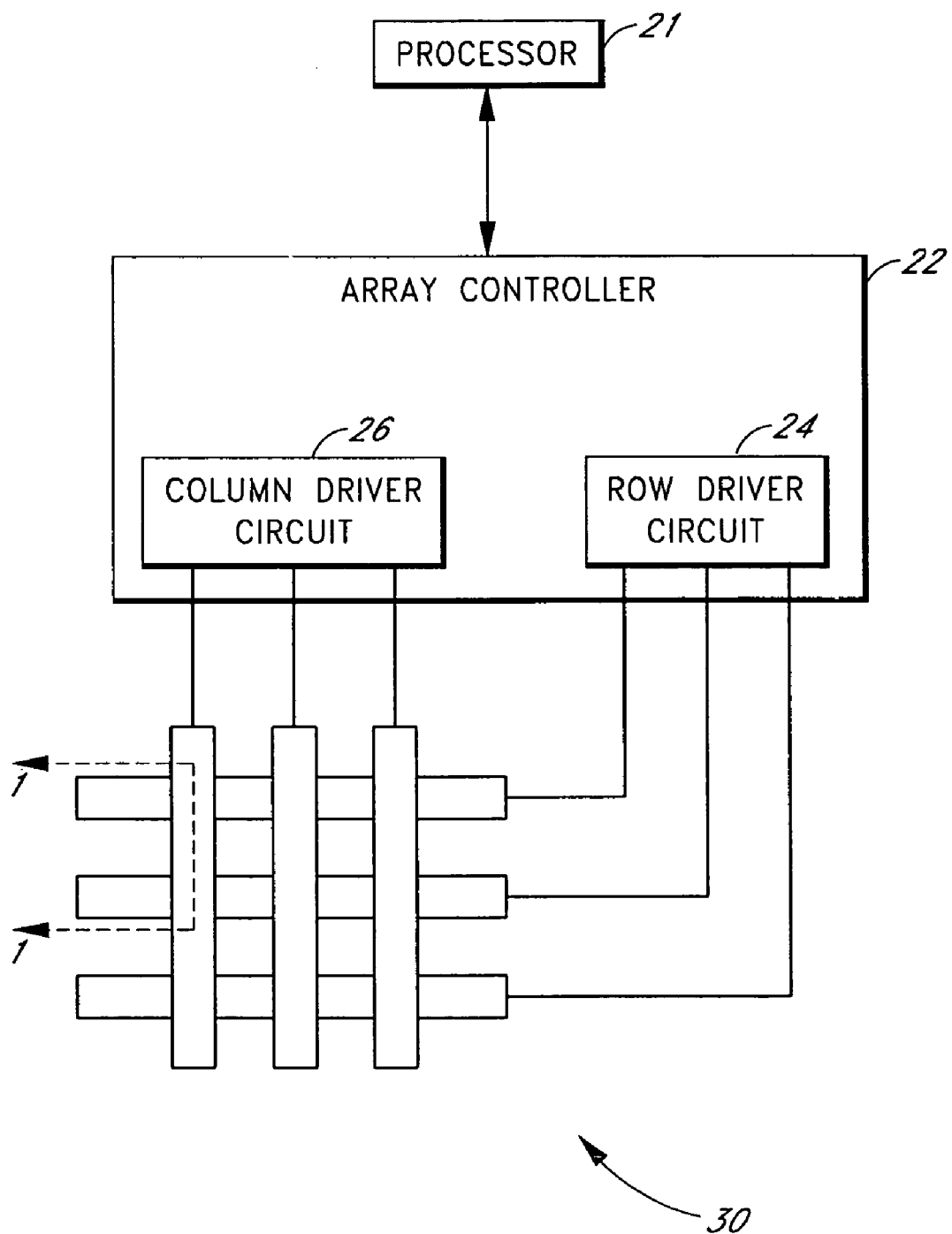
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
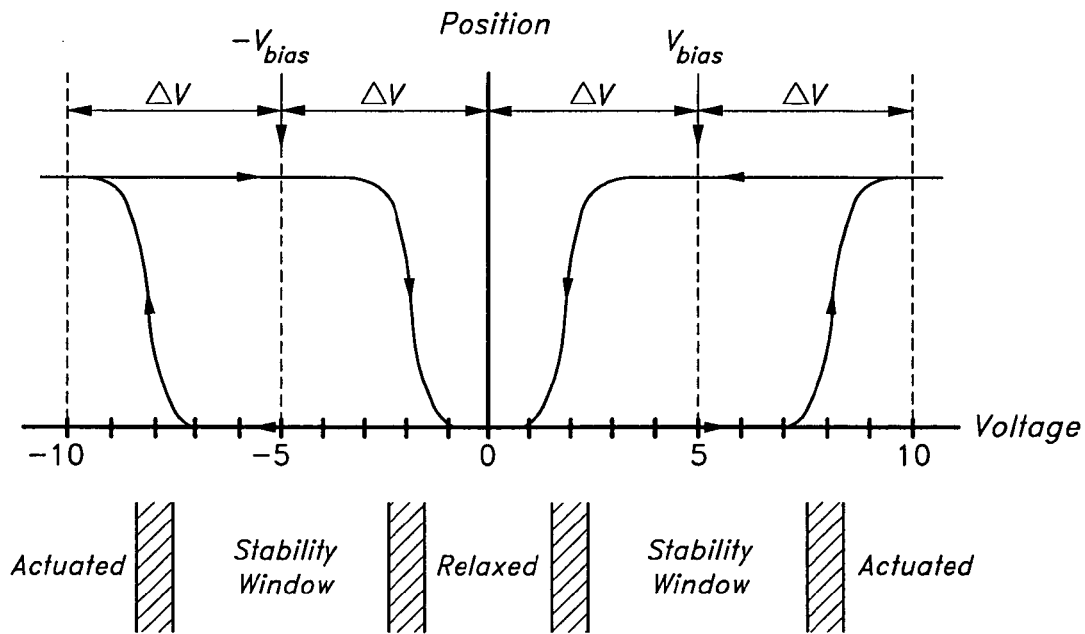
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+?V$, which may correspond to −5 volts and +5 volts respectively Relaxing the pixel is accomplished by setting the appropriate column to $+V_{bias}$, and the appropriate row to the same $+?V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-?V$. In this embodiment, releasing the pixel is accomplished by setting the appropriate column to $-V_{bias}$, and the appropriate row to the same $-?V$, producing a zero volt potential difference across the pixel.

Figure 5A:
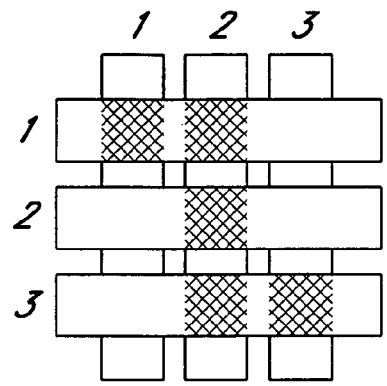
FIGS. 5A and 5B illustrate one exemplary timing diagram for row and column signals that may be used to write a frame of display data to the 3×3 interferometric modulator display of FIG. 2.
Figure 5B:
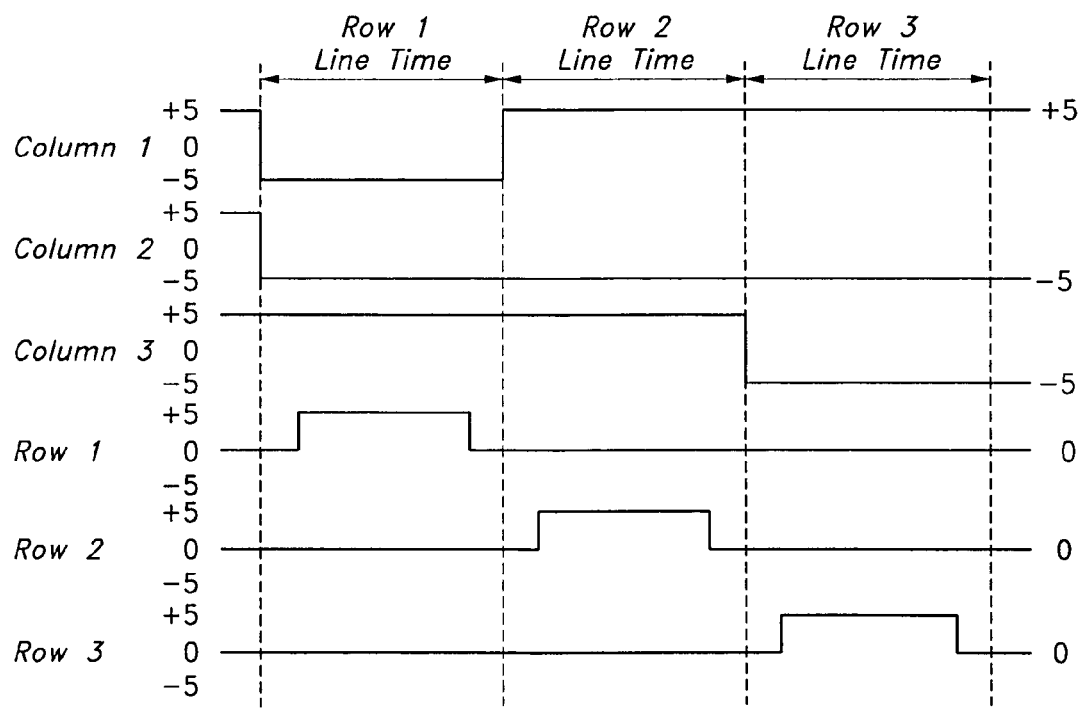

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
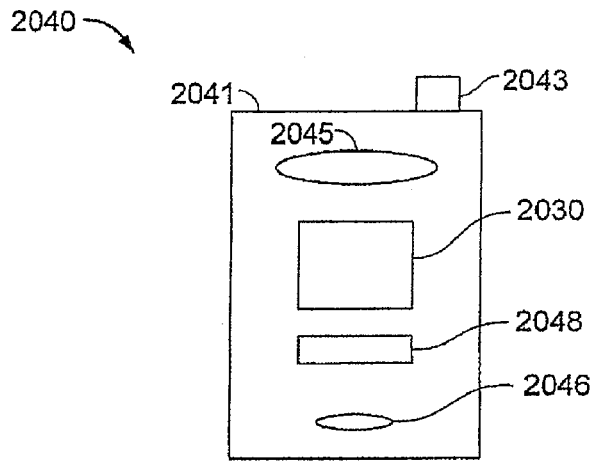
FIG. 6A is a system block diagram illustrating an embodiment of a display device.
Figure 6B:
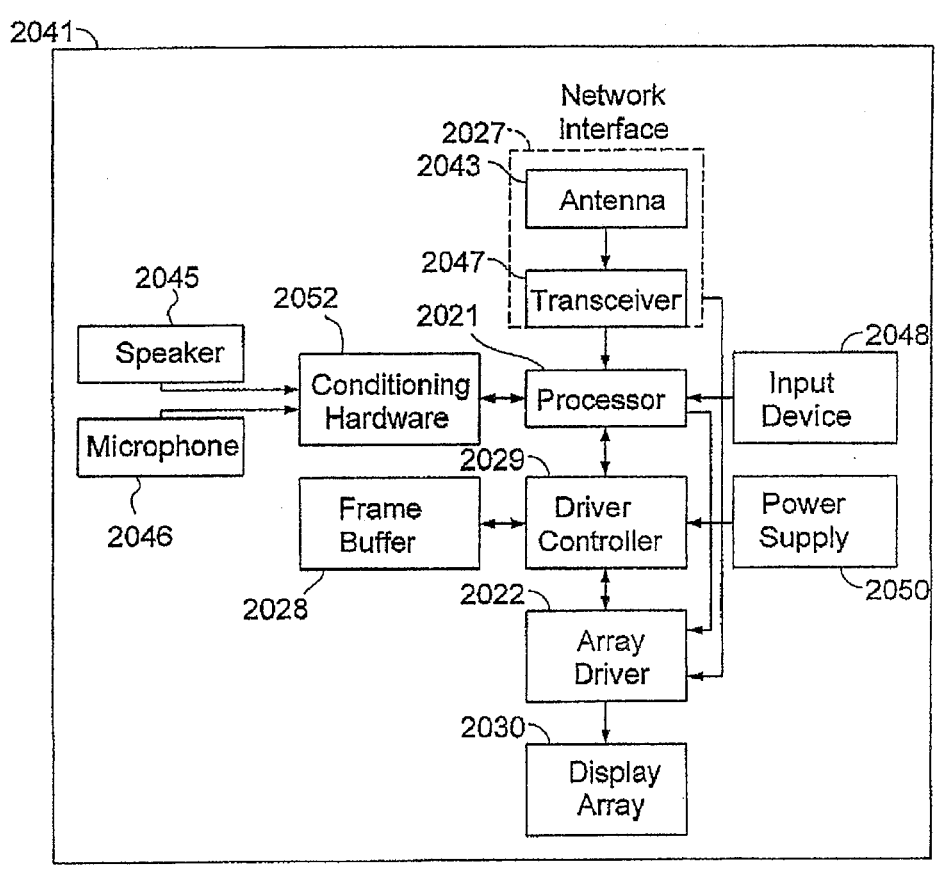
FIG. 6B is a system block diagram illustrating some components of an embodiment of a display device.

FIGS. 6A and 6B are system block diagrams illustrating an embodiment of a display device 2040. The display device 2040 can be, for example, a cellular or mobile telephone. However, the same components of display device 2040 or slight variations thereof are also illustrative of various types of display devices such as televisions and portable media players.

The display device 2040 includes a housing 2041, a display 2030, an antenna 2043, a speaker 2045, an input device 2048, and a microphone 2046. The housing 2041 is generally formed from any of a variety of manufacturing processes as are well known to those of skill in the art, including injection molding, and vacuum forming. In addition, the housing 2041 may be made from any of a variety of materials, including but not limited to plastic, metal, glass, rubber, and ceramic, or a combination thereof. In one embodiment the housing 2041 includes removable portions (not shown) that may be interchanged with other removable portions of different color, or containing different logos, pictures, or symbols.

The display 2030 of exemplary display device 2040 may be any of a variety of displays, including a bi-stable display, as described herein. In other embodiments, the display 2030 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 2030 includes an interferometric modulator display, as described herein.

The components of one embodiment of exemplary display device 2040 are schematically illustrated in FIG. 6B. The illustrated exemplary display device 2040 includes a housing 2041 and can include additional components at least partially enclosed therein. For example, in one embodiment, the exemplary display device 2040 includes a network interface 2027 that includes an antenna 2043 which is coupled to a transceiver 2047. The transceiver 2047 is connected to a processor 2021, which is connected to conditioning hardware 2052. The conditioning hardware 2052 may be configured to condition a signal (e.g. filter a signal). The conditioning hardware 2052 is connected to a speaker 2045 and a microphone 2046. The processor 2021 is also connected to an input device 2048 and a driver controller 2029. The driver controller 2029 is coupled to a frame buffer 2028, and to an array driver 2022, which in turn is coupled to a display array 2030. A power supply 2050 provides power to all components as required by the particular exemplary display device 2040 design.

The network interface 2027 includes the antenna 2043 and the transceiver 2047 so that the exemplary display device 2040 can communicate with one or more devices over a network. In one embodiment the network interface 2027 may also have some processing capabilities to relieve requirements of the processor 2021. The antenna 2043 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 2047 pre-processes the signals received from the antenna 2043 so that they may be received by and further manipulated by the processor 2021. The transceiver 2047 also processes signals received from the processor 2021 so that they may be transmitted from the exemplary display device 2040 via the antenna 2043.

In an alternative embodiment, the transceiver 2047 can be replaced by a receiver. In yet another alternative embodiment, network interface 2027 can be replaced by an image source, which can store or generate image data to be sent to the processor 2021. For example, the image source can be a digital video disc (DVD) or a hard-disc drive that contains image data, or a software module that generates image data.

Processor 2021 generally controls the overall operation of the exemplary display device 2040. The processor 2021 receives data, such as compressed image data from the network interface 2027 or an image source, and processes the data into raw image data or into a format that is readily processed into raw image data. The processor 2021 then sends the processed data to the driver controller 2029 or to frame buffer 2028 for storage. Raw data typically refers to the information that identifies the image characteristics at each location within an image. For example, such image characteristics can include color, saturation, and gray-scale level.

In one embodiment, the processor 2021 includes a microcontroller, CPU, or logic unit to control operation of the exemplary display device 2040. Conditioning hardware 2052 generally includes amplifiers and filters for transmitting signals to the speaker 2045, and for receiving signals from the microphone 2046. Conditioning hardware 2052 may be discrete components within the exemplary display device 2040, or may be incorporated within the processor 2021 or other components.

The driver controller 2029 takes the raw image data generated by the processor 2021 either directly from the processor 2021 or from the frame buffer 2028 and reformats the raw image data appropriately for high speed transmission to the array driver 2022. Specifically, the driver controller 2029 reformats the raw image data into a data flow having a raster-like format, such that it has a time order suitable for scanning across the display array 2030. Then the driver controller 2029 sends the formatted information to the array driver 2022. Although a driver controller 2029, such as a LCD controller, is often associated with the system processor 2021 as a stand-alone Integrated Circuit (IC), such controllers may be implemented in many ways. They may be embedded in the processor 2021 as hardware, embedded in the processor 2021 as software, or fully integrated in hardware with the array driver 2022.

Typically, the array driver 2022 receives the formatted information from the driver controller 2029 and reformats the video data into a parallel set of waveforms that are applied many times per second to the hundreds and sometimes thousands of leads coming from the display's x-y matrix of pixels.

In one embodiment, the driver controller 2029, array driver 2022, and display array 2030 are appropriate for any of the types of displays described herein. For example, in one embodiment, driver controller 2029 is a conventional display controller or a bi-stable display controller (e.g., an interferometric modulator controller). In another embodiment, array driver 2022 is a conventional driver or a bi-stable display driver (e.g., an interferometric modulator display). In one embodiment, a driver controller 2029 is integrated with the array driver 2022. Such an embodiment is common in highly integrated systems such as cellular phones, watches, and other small area displays. In yet another embodiment, display array 2030 is a typical display array or a bi-stable display array (e.g., a display including an array of interferometric modulators).

The input device 2048 allows a user to control the operation of the exemplary display device 2040. In one embodiment, input device 2048 includes a keypad, such as a QWERTY keyboard or a telephone keypad, a button, a switch, a touch-sensitive screen, a pressure- or heat-sensitive membrane. In one embodiment, the microphone 2046 is an input device for the exemplary display device 2040. When the microphone 2046 is used to input data to the device, voice commands may be provided by a user for controlling operations of the exemplary display device 2040.

Power supply 2050 can include a variety of energy storage devices as are well known in the art. For example, in one embodiment, power supply 2050 is a rechargeable battery, such as a nickel-cadmium battery or a lithium ion battery. In another embodiment, power supply 2050 is a renewable energy source, a capacitor, or a solar cell, including a plastic solar cell, and solar-cell paint. In another embodiment, power supply 2050 is configured to receive power from a wall outlet.

In some implementations control programmability resides, as described above, in a driver controller which can be located in several places in the electronic display system. In some cases control programmability resides in the array driver 2022. Those of skill in the art will recognize that the above-described optimization may be implemented in any number of hardware and/or software components and in various configurations.

Figure 7A:
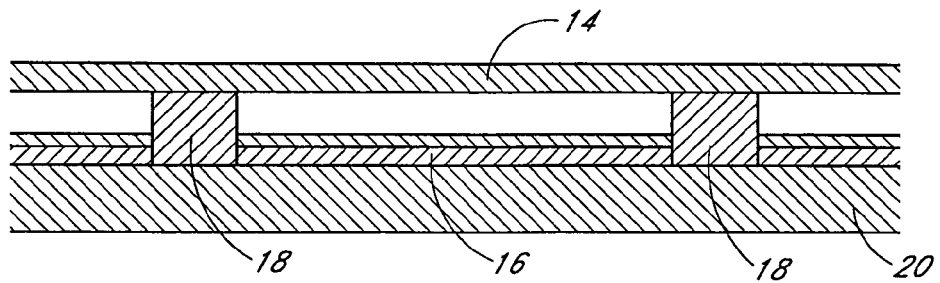
FIG. 7A is a cross section of the device of FIG. 1.
Figure 7B:
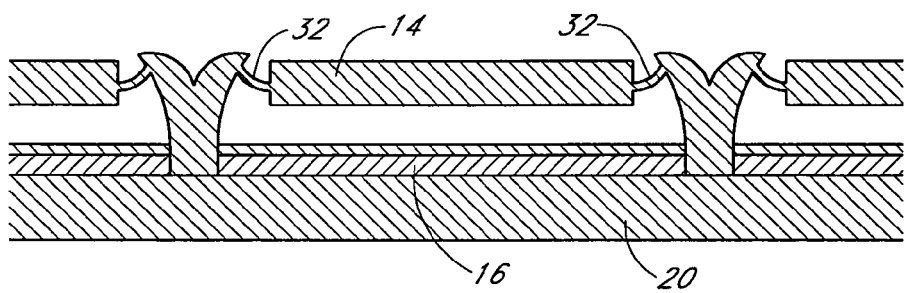
FIG. 7B is a cross section of an alternative embodiment of an interferometric modulator.
Figure 7C:
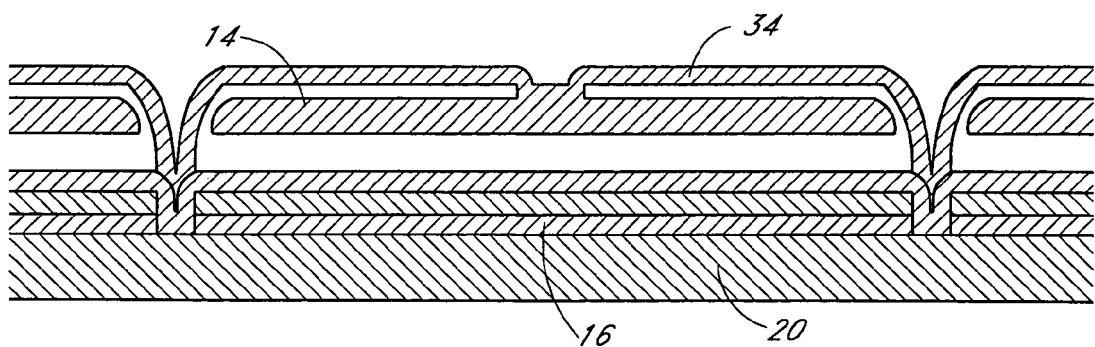
FIG. 7C is a cross section of another alternative embodiment of an interferometric modulator.

The details of the structure of interferometric modulators that operate in accordance with the principles set forth above may vary widely. For example, FIGS. 7A-7C illustrate three different embodiments of the moving mirror structure. FIG. 7A is a cross section of the embodiment of FIG. 1, where a strip of metal material 14 is deposited on orthogonally extending supports 18. In FIG. 7B, the moveable reflective material 14 is attached to supports at the corners only, on tethers 32. In FIG. 7C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of known techniques may be used to produce the above described structures involving a series of material deposition, patterning, and etching steps.

The above described interferometric modulator devices can be enclosed together in package. Various packages are contemplated and one of skill in the art will recognize that the particular characteristics of the package can depend upon the particular use for the interferometric modulator device.

Figure 8A:
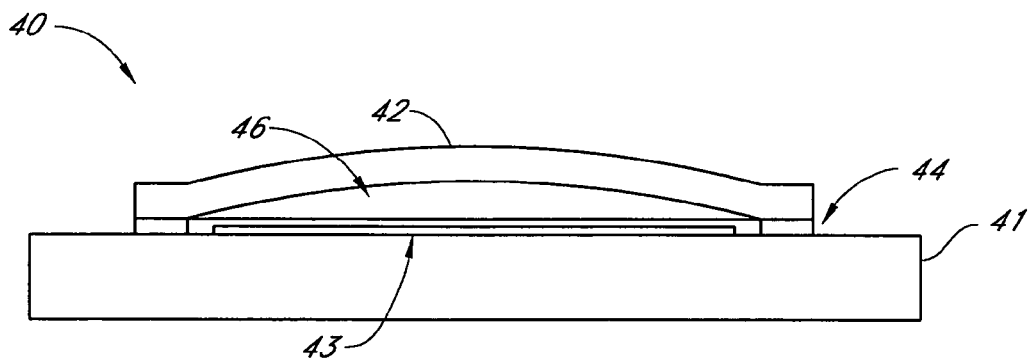
FIGS. 8A-8C are schematic views of a basic package structure for an interferometric modulator.
Figure 8B:
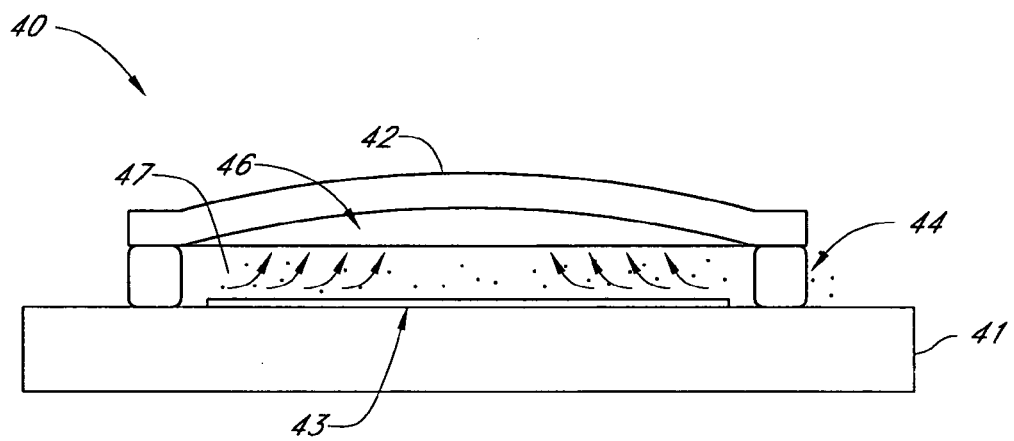
Figure 8C:
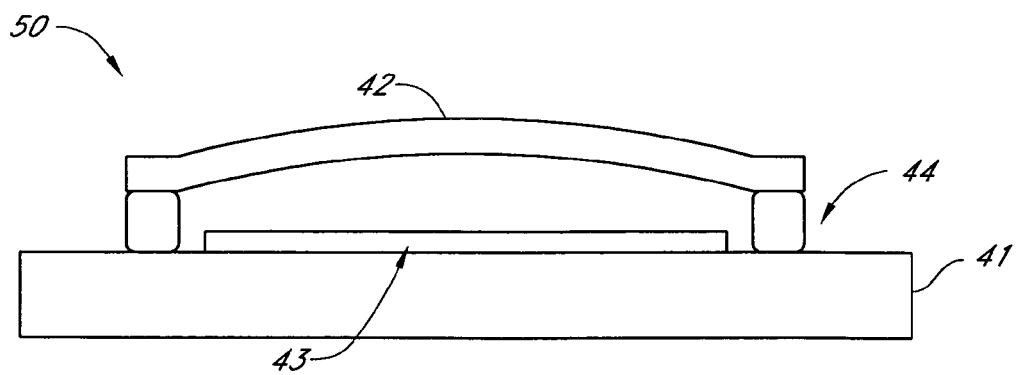

FIGS. 8A-8C are schematic views of a basic package structure for an interferometric modulator. As shown in FIG. 8A, the basic package structure 40 includes a transparent substrate 41 (e.g., glass) and a backplate or "cap" 42. As illustrated in FIGS. 8A-8C, an interferometric light modulator array 43 is encapsulated within the package structure 40. The backplate 42 can be formed of any suitable material, such as glass, metal, foil, polymer, plastic, ceramic, or semiconductor materials (e.g., silicon).

A seal 44 is typically provided to join the transparent substrate 41 and backplate 42 to form the package structure 40. Depending on the embodiment, the seal 44 can be a non-hermetic, semi-hermetic, or hermetic seal. An example of a hermetic sealing process is disclosed in U.S. Pat. No. 6,589,625.

In one embodiment, a desiccant 46 is provided within the package structure 40 to reduce humidity within the package structure 40. In one embodiment, the desiccant 46 is positioned between the array 43 and the backplate 42. Desiccants can be used for packages that have either hermetic or semi-hermetic seals. Suitable desiccant materials include, but are not limited to, zeolites, molecular sieves, surface adsorbents, bulk adsorbents, and chemical reactants. The desiccant 46 can also be referred to as a getter material or can be used in addition to a getter material where the getter material is removing other materials such as oxygen or particles. In one embodiment, the amount of a desiccant used in the interior of the package 40 is chosen to absorb the water vapor that permeates through the seal 44 during the lifetime of the device 40.

Generally, the packaging process can be accomplished in a vacuum, pressure between a vacuum up to and including ambient pressure, or pressure higher than ambient pressure. The packaging process may also be accomplished in an environment of varied and controlled high or low pressure during the sealing process.

FIG. 8B illustrates flux of water vapor into the package 40 and absorption of the permeated water vapor by the desiccant 46. Referring to FIG. 8B, the desiccant 46 absorbs water or water vapor existing in the interior of the package 40 at the time the package was sealed. The desiccant 46 also absorbs water or water vapor 47 which has been permeated into the interior of the package 40 after the package was sealed as shown in FIG. 8B.

In one embodiment, the package structure 50 can eliminate the need for a desiccant as shown in FIG. 8C. In this embodiment, the seal 44 is preferably a hermetic seal so that moisture traveling from the atmosphere into the interior of the package 50 is prevented or minimized. In another embodiment, instead of sealing a separate backplate 42 to the transparent substrate 41, a thin film (not shown) can be deposited on the transparent substrate 41 to encapsulate the array 43 within the package structure 50. Thus, the function of a backplate would be accomplished by the encapsulating layer.

As will be appreciated by one of skill in the art, the presence of a desiccant can be beneficial in reducing the amount of water vapor in the package, which in turn results in less water between the transmissive and reflective layers. A reduction in water can be advantageous because it helps reduce stiction forces that can build up between the transmissive and reflective layers. However, there are alternative approaches to reducing stictional forces as well. For example, the use of a protective coating, described in more detail below, can act not only as an anti-stiction coating, but also provide structural integrity to other layers associated with the reflective and transmissive layers. The protective coating is discussed in more detail below.

Figure 9:
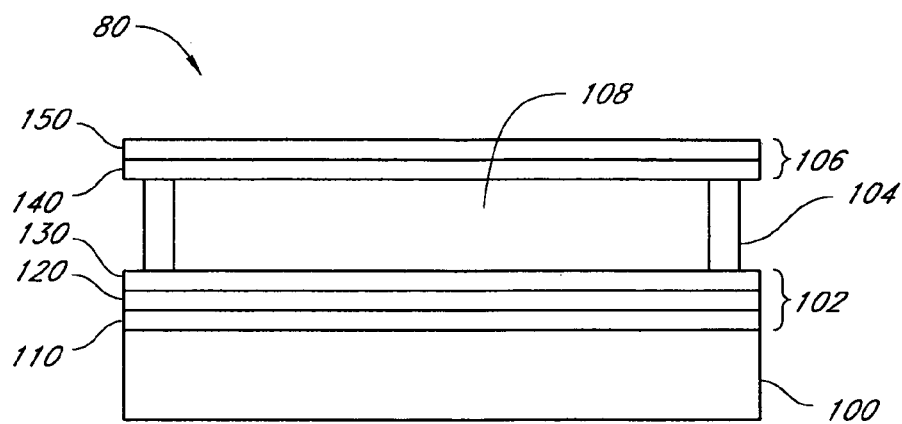
FIG. 9 is a detailed side view of an interferometric light modulator.

FIG. 9 is a detailed side view of interferometric light modulating device 80 comprising a light modulating cavity 108 where optical resonance occurs between a fixed transmissive layer 102 and a moveable reflective layer 106. A transmissive layer 102 transmits light and can be partially reflective. A moveable reflective layer 106 reflects light and can be partially transmissive. As will be appreciated by one of skill in the art, a variety of terms can be used to describe these two layers. The primary factor to consider is that the device should function as an interferometric modulator and that the description of "reflective" or "transmissive" between the two layers is relative. Alternative terms that can indicate the transmissive layer can include fixed layer, partially reflective layer, transmissive element, and primary conductor. Alternative terms that can indicate the reflective layer can include movable or deformable, highly reflective layer, reflective element, and secondary conductor.

The transmissive layer 102 is layered upon a transparent substrate 100, which can be any transparent substrate capable of having thin film MEMS devices built upon it. Such transparent substances include, but are not limited to, glass, plastic, and transparent polymers. The reflective layer 102, depicted here as a thin film stack of multiple sublayers, typically comprises an electrode sublayer 110 and a primary mirror sublayer (or transmissive sublayer) 120. The primary mirror sublayer 120 can be made of a metallic film. In some embodiments an insulating sublayer 130 is disposed above the primary mirror sublayer 120 and functions as an insulator and also enhances reflection from the transmissive layer 102. The moveable reflective layer 106, depicted here as a membrane of multiple sublayers, typically includes a secondary mirror sublayer 140 and an electrode sublayer 150. The secondary mirror sublayer 140 can be made of a metallic film. Supports 104 are formed to support the moveable reflective layer 106. In one embodiment, the supports 104 are insulators. The electrode layers 110 and 150 are connected to the voltage source (V) shown in FIG. 1 so that the voltage (V) can be applied across the two layers 102 and 106. Other interferometric modulator configurations and operating modes are disclosed in U.S. Pat. No. 5,835,255.

As used herein, the terms reflective layer and transmissive layer are to be given their broadest ordinary meaning. A reflective layer is at least one layer that reflects light and may be partially transmissive to light. The term reflective layer can refer to, but is not limited by, the layers described herein as the reflective layer 106 or the secondary mirror sublayer 140. A transmissive layer is at least one layer that transmits light and can partially reflect light. The term transmissive layer can refer to, but is not limited by, the layers described herein as the transmissive layer 102 or the primary mirror sublayer 120. When the term "element" is employed, it is generally meant to denote the larger, or part of the larger, section of the device that is involved with one of the layers. Thus, as shown in FIG. 9, 106 can be referred to as the reflective element. The term "layer," as in, the "reflective layer" in FIG. 9, can be used to describe either the entire reflective layer 106, or the particular layer (secondary mirror or sublayer) 140 that is reflective. The term "sublayer" or "subelement" generally refers to the particular layer with the particular properties (e.g., item 140).

Referring to FIG. 9, in the driven state of an interferometric light modulating device 80, the reflective layer 106, depicted here as a membrane, may make contact with the transmissive layer 102, depicted here as a thin film stack. When a potential difference is applied to layers 102 and 106, a capacitor is formed between these two layers, which creates electrostatic forces that pull the reflective layer 106 towards the transmissive layer 102. This results in the cavity 108 collapsing. If the voltage is high enough, the reflective layer 106 can be deformed and forced against the transmissive layer 102 completely collapsing the cavity 108. When no potential difference is applied, however, the mechanical restoration forces of the reflective layer 106 and its surrounding structure can return layer 106 to its original position, thereby restoring the cavity 108. But even in the undriven state, both of the layers 106 and 102 are closely located to each other, e.g., about 0.2 µm. Thus, the mechanical restoration forces of the moveable highly reflective layer 106 should be carefully balanced with the electrostatic forces created between the layer 106 and the transmissive layer 102 in order to ensure proper operation and responsiveness of the interferometric light modulating device 80.

Protective Coatings

Over time, the various layers can begin to experience imperfections due to wear and tear and general usage. In order to reduce the risk that a layer (e.g., the insulating layer) will experience a failure, a protective coating can be applied to the surface of the insulating layer on the transmissive layer or on the surface of the reflective layer.

In addition to physical protection of the layers, there are other uses and benefits associated with a protective coating. For example, there are additional attractive forces that may disturb the balance of forces described above. These additional attractive forces can be due to water condensation on each device or van der Waals forces which hold two layers together. During the lifetime of an interferometric light modulating device, water vapor (or water) can continuously permeate into the interior of the device (as depicted in FIG. 8B) and the permeated water vapor can exist on the surfaces of each of the layers 102 and 106. The water vapor can cause the two layers 102 and 106 to have an additional attractive capillary force between them due to water condensation. Furthermore, the van der Waals forces, which are short range forces causing adjacent materials to become attracted at the molecular level, can cause the layers 102 and 106 to have an additional attractive force between them. In an interferometric light modulating device 80, the moveable reflective layer 106, including the secondary mirror sublayer 140, moves toward and from the fixed transmissive layer 102, which includes the primary mirror sublayer 120, depending on the operation state. If there are additional attractive forces between layers 102 and 106, the device 80 may fail to operate properly, even to the point to where the layers may stick together. Thus, in embodiments of the invention, means for reducing attractive forces between layers 102 and 106 include a protective coating applied on one or more of the layer surfaces (or sublayer surfaces) of an interferometric light modulating device 80 so that the additional attractive forces between adjacent surfaces due to events such as capillary water condensation or van der Waals forces may be minimized or eliminated.

As used herein, the term "protective" coating is to be given its broadest ordinary meaning, including but not limited to, a material that reduces attractive forces between surfaces and/or a material that reduces the breakdown of layers it is covering. The term protective coating can refer to, but is not limited to, a self-aligned monolayer ("SAM" also referred to as a self-assembled monolayer). In some embodiments, an example of a protective coating includes, but is not limited to, a self-aligning monolayer such as one or more of the following: fluoro silane, chloro-fluoro silane, methoxy silane, trichlorosilane, perfluorodecanoic carboxylic acid, octadecyltrichlorosilane (OTS), or dichlorodimethylsilane. In some embodiments, examples of protective coating include, but are not limited to, polymeric materials such as one or more of the following: teflon, silicone, polystyrene, polyurethane (both standard and ultraviolet curable), a block copolymer containing a hydrophobic component (for example poly-methylmethacrylate), or polysilazane (especially with polisiloxane). In some embodiments, an example of a protective coating includes, but is not limited to, inorganic materials such as one or more of the following: graphite, diamond-like carbon (DLC), silicon carbide (SiC), a hydrogenated diamond coating, or fluorinated DLC.

In some embodiments, the protective coating does not significantly adversely affect the optical responses or characteristics of the optical cavity 108, such as the optical responses and/or characteristics of layers 102 or 106. At any rate, changes in the characteristics of the optical cavity due to the presence of the protective coating can be compensated by adjusting the parameters of the layers and sublayers. As will be appreciated by one of skill in the art, not all of these protective coatings will be as readily regenerated as others. Exemplary materials for the regenerating protective coatings include, for example, self-aligning monolayers, such as polytetrafluoroethylene (PTFE), octadecyltrichlorosilane (OTS), and perfluorodecanoic carboxylic acid, although, in light of the present disclosure, one of skill in the art will be able to determine alternatives as well. In some embodiments, materials that can serve as regenerable protective coatings are those that are self-limiting and self-aligning in their deposition so that a single monolayer of material is deposited over an exposed area to be covered. Additionally, as the regeneration process can be temperature dependent, those materials that change state from solid to liquid or gas at sufficiently low temperatures can also be ideal.

Figure 10:
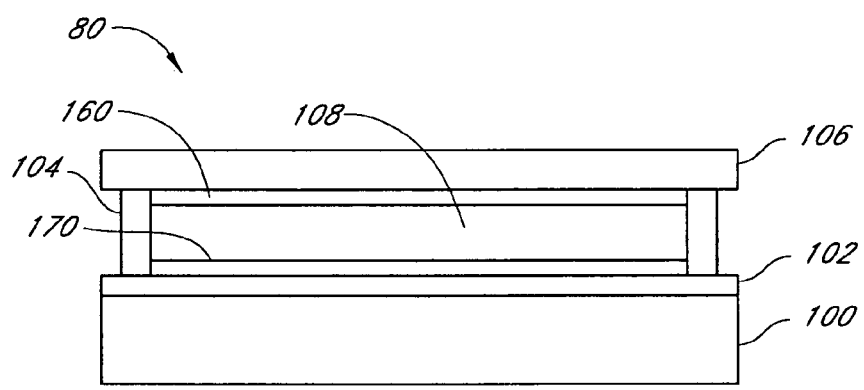
FIG. 10 illustrates an interferometric modulator coated with protective material according to one embodiment of the invention.

FIG. 10 illustrates an interferometric light modulating device 80 with portions of layers 102 and 106 within the light modulating cavity 108 coated with protective coating 160 and 170, respectively, according to one embodiment of the invention. In other embodiments, at least a portion of all surfaces within the light modulating cavity 108 are coated with a protective material, including the supports 104. In another embodiment, only one surface of the device is coated with the protective coating. As will be appreciated by one of skill in the art, often, much of the benefit can be achieved by covering just one surface.

As noted above, an insulator layer can be formed on the conductor layer, and the protective coating (e.g., self-aligned monolayer) can be formed on the insulator layer. However, since the insulator layer can be photographically patterned during normal fabrication of the interferometric modulator, the insulator layer can be selectively removed from any desired layer. Therefore, in the following description, when it is most convenient and effective for the protective coating to reside on the conductor layer one can assume that is the case. Where it is most convenient and effective for the protective coating to reside on the insulator layer one can assume that is the case. However, one of skill in the art will also realize that other variations are also possible. When the protective coating is on either an "element" or a "layer," the coating can be on any of the layers associated with the layer or element (e.g., insulator, conductor, primary protective coating, etc.). When the protective coating is on a sublayer or is "directly" on a layer, the coating is then placed immediately against the particular layer named.

Figure 11:
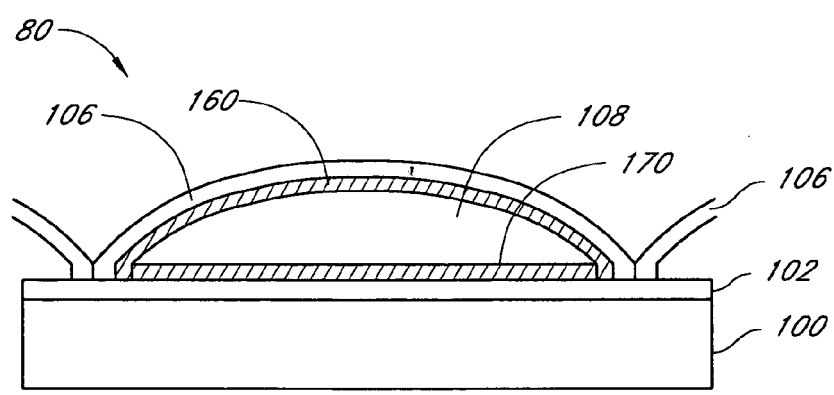
FIG. 11 illustrates an interferometric modulator coated with protective material according to another embodiment of the invention.

FIG. 11 illustrates an alternative embodiment of interferometric light modulating device 80 with layers 102 and 106 coated with a protective material according to another embodiment of the invention. In this embodiment, protective coating 160 and 170 are formed on surfaces of the layers 106 and 102 that are interior to the cavity 108. In this embodiment, the moveable reflective layer 106 includes its own vertical support mechanism via a domed shape, unlike the FIG. 10 embodiment where there are separate posts 104 formed between the two layers 106 and 102. Although FIGS. 10 and 11 depict protective coatings 160 and 170 as covering the entire surface of layers 102 and 106 within light modulating cavity 108, only coating a portion of layer 102 and/or layer 106 is contemplated by the present invention. For example, in one embodiment, only a portion of layer 102 comprises a protective coating. In another embodiment, only a portion of layer 106 comprises a protective coating. As will be appreciated by one of skill in the art, the reflective layer can take on other shapes (e.g., other than a dome). For example, a multi-radius shape, or a shape with curved corners can also be used. The claimed device need not be limited by the shape of the reflective layer.

Figure 12A:
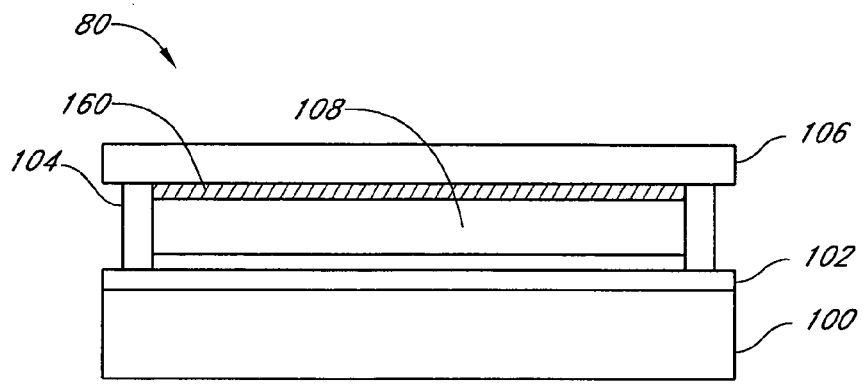
FIGS. 12A, 12B, and 12C illustrate an interferometric modulator coated with protective material according to another embodiment of the invention.
Figure 12B:
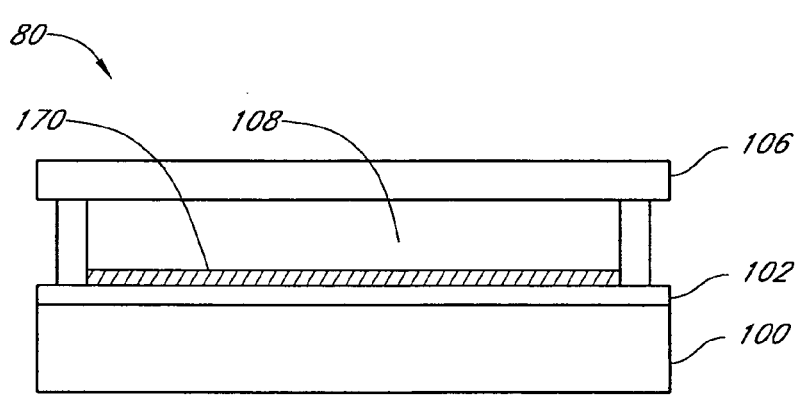
Figure 12C:
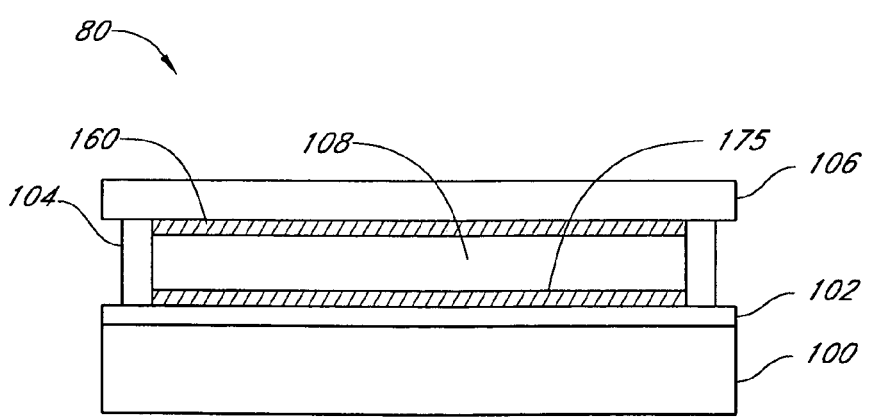

FIGS. 12A, 12B, and 12C illustrate an interferometric light modulating device 80 with selective coating of one or more layers according to embodiments of the invention. In FIG. 12A, the protective coating 160 is provided on the surface of the moveable reflective layer 106 and not on the fixed transmissive layer 102. Conversely, in FIG. 12B, the protective coating 170 is provided on the surface of layer 102 and not on layer 106. In some embodiments, the protective layer is provided selectively on a specific material. In other embodiments, the protective layer is provided on all materials proximally co-planar with a particular layer. In other embodiments, the protective layer is applied throughout the entire package of the device. In some embodiments, multiple layers of a protective coating are on a single reflective or transmissive layer. For example, there can be two protective coatings on a single reflective layer. In some embodiments, it may be difficult to get just the desired species to stick to a desired surface. In this case, one can put down a monolayer "adhesion promoter" to modify the surface and then put down the anti-stiction or protective coating.

As depicted in FIG. 12C, one way to accomplish the selective coating illustrated in FIGS. 12A and 12C is to use a covering element 175. During the coating process, the surfaces which are not intended to be coated, depicted here as the fixed transmissive layer 102, can be covered with the covering element 175, such as a sacrificial material, so that the protective coating is not formed on the surfaces covered by the covering element 175. In other embodiments, the covering element 175 can be provided on any surface(s) within the cavity 108 where a protective coating is not desired, such as the surface of posts 104 that are within the cavity 108.

Figure 13A:
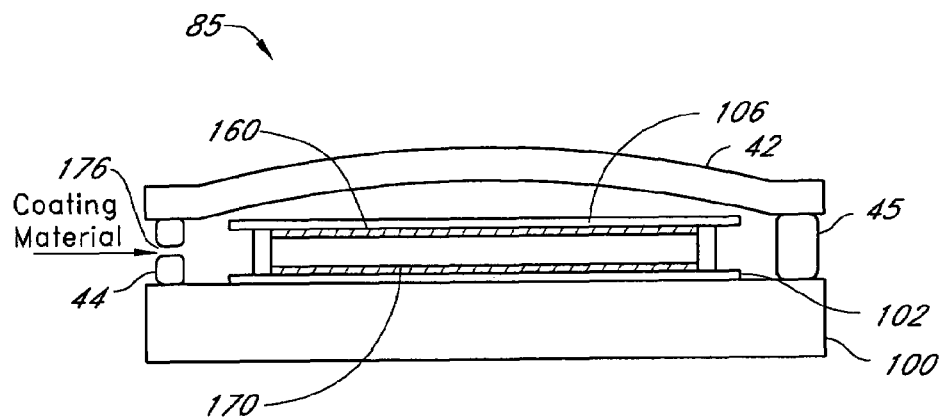
FIGS. 13A and 13B illustrate an interferometric modulator coated with protective material according to still another embodiment of the invention.
Figure 13B:
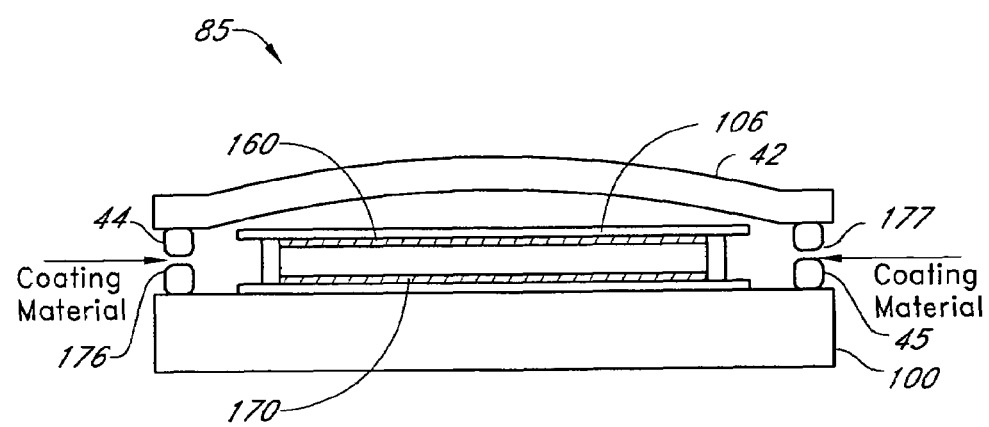

FIGS. 13A and 13B illustrate an interferometric light modulating device package 85 with layers 102 and layer 106 coated with protective material according to another embodiment of the invention. In these embodiments, layers 102 and 106 are encapsulated within the package 85 and the application of the protective coating is performed after the package 85 is fabricated. In one embodiment, the backplate 42 is a recessed structure or a formed structure, but not necessarily so if the amount of a desiccant (not shown in FIGS. 13A and 13B) in the package 85 is reduced or removed. In this embodiment, the requirements on the recessed depth can be lessened or eliminated. In one embodiment, the use of protective coatings 160 and 170 (e.g., self-aligning monolayers) can allow for altered cap (backplate) designs to reduce the required recess compared to the recess needed if using a desiccant.

In the embodiments depicted in FIGS. 13A and 13B, an orifice 176 is defined in the package, e.g., in the seal 44 as shown in FIG. 13A or 13B. In these embodiments, the protective coating material can be supplied into the interior of the package 85 via the orifice 176. In another embodiment, two orifices 176 and 177 are created in the package 85, e.g., in the seals 44 and 45 for the delivery of the protective material, as shown in FIG. 13B. In still another embodiment, more than two orifices (not shown) can be defined in the package 85 and the protective coating material is supplied into the interior of the package via the orifices. In other embodiments, orifice(s) can be formed in the substrate 100 or the backplate 42. Thus, having orifice(s) within the seal 44, substrate 100, and/or backplate 42 for the delivery of the protective coating is within the scope of the present invention.

In these embodiments, the orifice(s) formed in the package 85 can also be used to remove water vapor from the interior of the package 85. After the orifice(s) are no longer needed, they may be plugged, welded or sealed, depending on the nature of the orifice(s).

Figure 14:
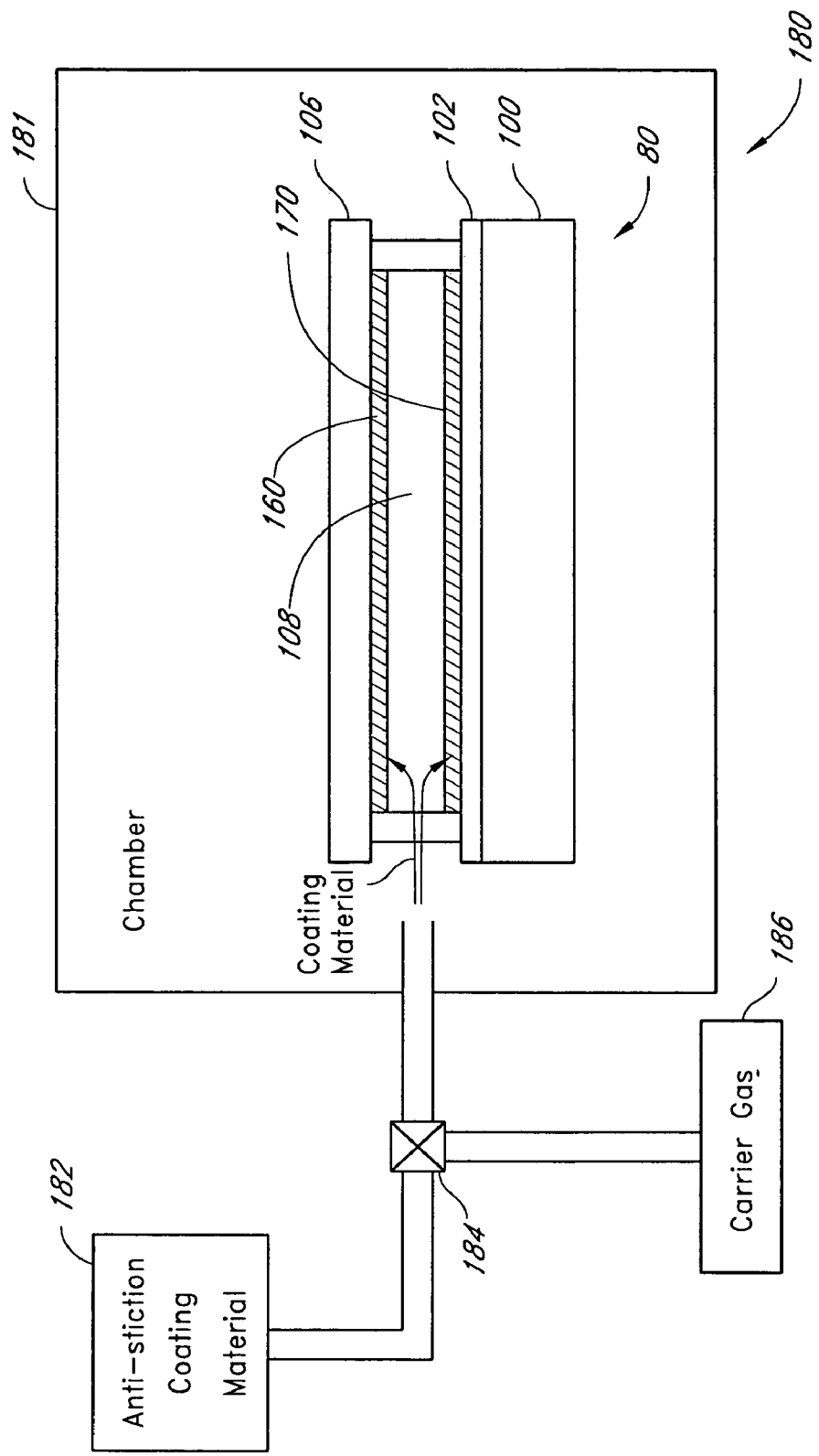
FIG. 14 illustrates a protective coating system for an interferometric modulator according to one embodiment of the invention.

FIG. 14 illustrates a protective coating system for an interferometric light modulating device 80 according to one embodiment of the invention. Referring to FIG. 14, the system 180 comprises a chamber 181, a coating material container 182, a valve 184, and a carrier gas reservoir 186. A person skilled in the art will appreciate that the system 180 is only exemplary and other coating systems, which can exclude some of the elements or layers of the system 180 and/or include additional elements, can be used. In one embodiment, the system 180 can perform a protective coating for the fabricated package as shown in FIGS. 12A, 12B and 12C.

The valve 184 controls feeding the coating material into the chamber 181. In one embodiment, the valve 184 is controlled by a computing device. In one embodiment, the valve 184 can be any suitable valve for this protective coating process. In another embodiment, the valve 184 can be used to properly mix and time the carrier gas with the an etchant gas, such as $XeF_2$.

The container 182 contains protective coating material. In various embodiments, as discussed above, an example of a protective coating can include, but is not limited to, the following: a self-aligning (or self-assembling) monolayer such as OTS, dichlorodimethylsilane, etc.; other polymeric materials such as teflon, polystyrene, etc.; or other inorganic materials such as graphite, DLC, etc. In another embodiment, the coating material includes any protective material which does not significantly adversely affect the optical responses or characteristics of the optical cavity 108, such as the optical responses and/or characteristics of layers 102 or 106. In a preferred embodiment, the protective coating material comprises a self-assembling monolayer with a relatively low melting or vaporization point. This can allow the protective coating to be regenerated after a device containing the interferometric modulator device has been assembled at relatively low temperatures.

In one embodiment, the carrier gas reservoir 186 contains a carrier gas such as nitrogen ($N_2$) or argon, which is used to transport the protective material to the chamber 181 by a known pumping mechanism. In another embodiment, the carrier gas can incorporate other types of getter material or chemistries as long as the performance of the interferometric light modulating device 80 is not significantly adversely affected. In another embodiment, the carrier gas can be integrated into the chemistry of the release etchant gas of $XeF_2$.

Figure 15:
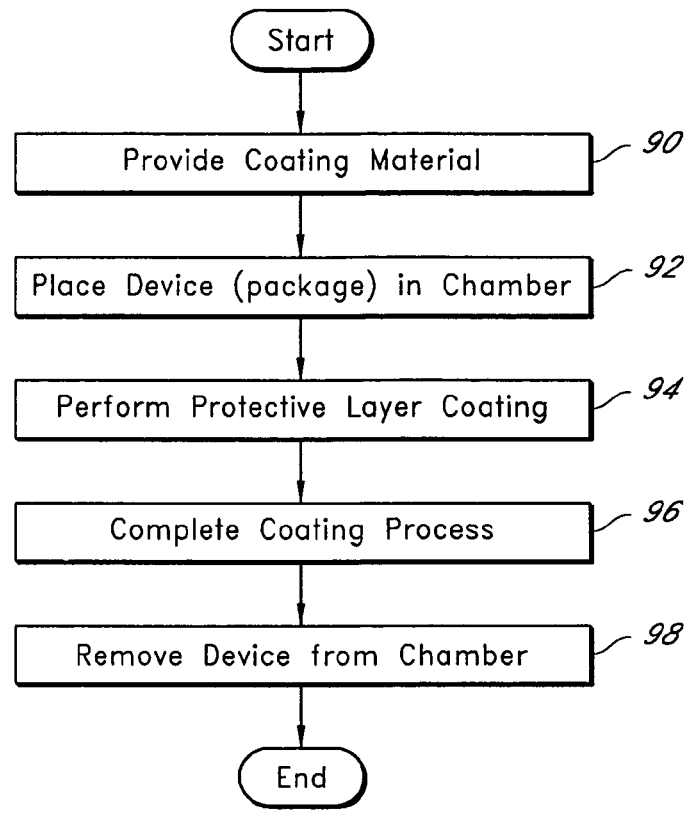
FIG. 15 is a flow chart of a method of providing a protective coating to a MEMS device according to one embodiment of the invention.

FIG. 15 is an exemplary flowchart describing a protective coating process according to one embodiment of the invention. One of skill in the art will appreciate that depending on the embodiments, additional steps can be added, others removed, or the order of the steps changed. FIG. 15, demonstrates the protective coating procedure according to embodiments of invention and as shown in FIGS. 8-13.

Protective coating material is provided in step 90. The interferometric light modulating device 80, whose surface(s), such as layers 102 and/or 106, will be coated, is placed in the chamber 181 at step 92. A protective coating is applied on the surfaces to be coated in step 94. In one embodiment, the surface of layers 102 and/or 106, such as a mirror surface or an insulator surface, can be heated so that water vapor existing on the surfaces to be coated is removed before the protective coating is performed. In one embodiment, the insulating sublayer 130 is not provided and the protective coating is formed on the surface of the primary mirror sublayer 120 (depicted in FIG. 9). In another embodiment, the protective coating is formed on the surface of the secondary mirror sublayer 140 (depicted in FIG. 9). In another embodiment, the protective coating is formed on the surfaces of the insulating sublayer 130 and secondary mirror sublayer 140 (depicted in FIG. 9).

In one embodiment of the protective coating process, the protective coating is formed during an interferometric light modulating device fabrication process. For example, the protective coating can be incorporated into a "release" process. In the release process, a sacrificial layer 175 (depicted in FIG. 12C) of the interferometric light modulating device 80 is etched away with the use of a gas, for example, $XeF_2$. In one embodiment, a mixture of the protective coating material and $XeF_2$ can be pumped into the chamber 181. In another embodiment, the protective coating can be applied after the $XeF_2$ etching is complete. Typically, the release process is performed by a MEMS etching system, for example, X3 Series Xetch available from XACIX, USA, and MEMS ETCHER available from Penta Vacuum, Singapore.

In another embodiment of the protective coating process, the protective coating is uniform in its thickness. In another embodiment, the thickness of the protective coating is not uniform. Generally, a protective coating such as a self-aligned monolayer is a thin film coating and thus it does not significantly affect the optical characteristics (or responses) of the layers 102 or 106, including mirrors 120 and 140 (depicted in FIG. 9), even if the protective coating is not uniform.

In one embodiment, the protective coating is performed using a process disclosed in, for example, "Dichlorodimethylsilane as an Anti-Stiction Monolayer for MEMS," Journal of Microelectromechanical Systems, Vol. 10, No. 1, March 2001 and U.S. Pat. No. 6,335,224. In another embodiment, the protective coating is performed using a deposition process, such as chemical vapor deposition or a physical vapor deposition. In still another embodiment, any suitable protective coating method on mirror or insulator surfaces, either known or developed in the future, can be used. The protective coating process is then completed in step 96 and the interferometric light modulating device 80 is removed from the chamber 181 in step 98.

Figure 16:
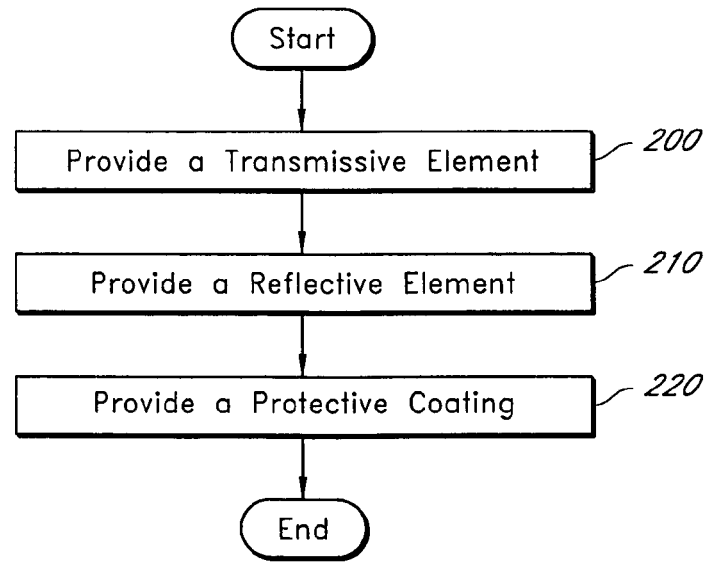
FIG. 16 is a flow chart of a method of providing a protective coating to an interferometric light modulating device according to one embodiment of the invention.

FIG. 16 is a flowchart describing a method for applying a protective coating for an interferometric light modulating device according to one embodiment of the invention. This Figure illustrates another method for reducing attractive forces between layers within a light modulating device. In accordance with this method, the interferometric light modulating devices described in the instant application can be fabricated, including the devices described with reference to FIGS. 8-13. In this method, a transmissive element is provided in step 200. The transmissive element can be provided by layering a transmissive layer upon a substrate. This transmissive element can be, for example, the entire fixed transmissive element 102 or any of its sublayers, such as the primary mirror sublayer (transmissive sublayer) 120, the insulating sublayer 130, or electrode sublayer 110 depicted in FIG. 9. A reflective element is provided in step 210. The reflective element can be provided by forming a thin film stack over the transmissive element. This reflective element can be, for example, the moveable reflective layer 106 or any of its sublayers, such as the secondary mirror sublayer 140 or the electrode sublayer 150 depicted in FIG. 9. A protective coating is then provided in step 220, wherein the protective coating is located between at least a portion of the reflective layer and the transmissive layer. The protective coating can be provided as described herein with reference to FIGS. 12-15. A person skilled in the art will appreciate that the method depicted in FIG. 16 is only exemplary and other coating methods, which can exclude some of the elements or steps in the depicted method and/or include additional elements, layers, or steps, can be used.

For example, in another embodiment, the reflective element can be provided before the transmissive element is provided. Also, in other embodiments, the protective coating is provided after either the reflective element or the transmissive element is provided. Also, in other embodiments, covering elements, such as a sacrificial layer, can be applied to portions of the interferometric light modulating device where a protective coating is not desired. Then, if desired, after the protective coating is provided, other elements may make contact with the coated covering element(s), thereby providing a protective coating by transfer contact. The covering elements and/or sacrificial layers can then be etched. In other embodiments, a sacrificial layer is provided between the reflective element and the transmissive element and the sacrificial layer is then etched prior to providing the protective coating. In other embodiments, the transmissive element and reflective element are packaged into an interferometric light modulating device package, such as one depicted in FIGS. 13A and 13B, prior to providing the protective coating. In other embodiments the protective coating is provided prior to the packaging.

Regeneration of the Protective Coating

Figure 17:
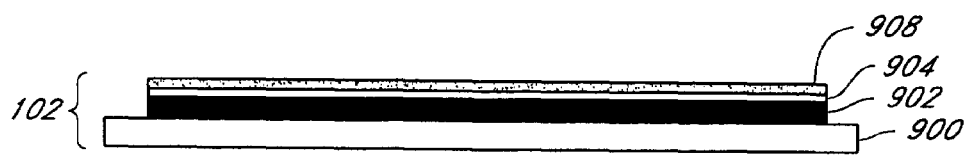
FIG. 17 is a side-view illustrating another embodiment of a conductor configuration for an individual cavity of an interferometric modulator element comprising a protective coating.

FIG. 17 shows a simplified and enlarged side-view of another embodiment of a transmissive element or layer 102 that can be used in a MEMS configuration. The transmissive element has a protective coating, e.g., monolayer, 908 deposited over an insulator layer 904. The insulator layer 904 is on a transmissive layer 902 which is on the substrate 900. There can be an electrode layer, e.g., as shown in FIG. 9, between layer 902 and the substrate 900. The insulating layer 904, can be formed, for example, by oxidizing, if aluminum is being used, in an oxygen plasma; thus, forming a thin layer of aluminum oxide.

Figure 18A:
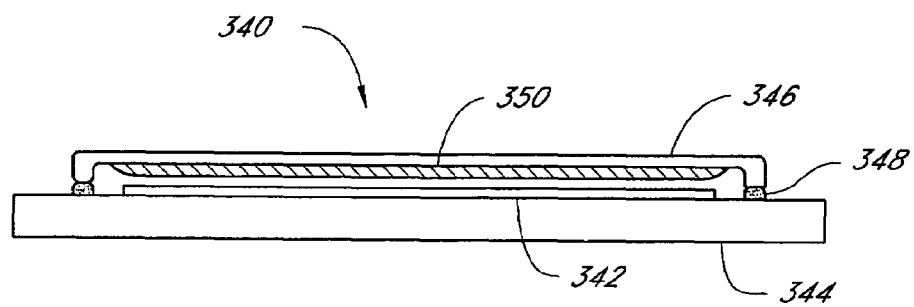
FIG. 18A is a side-view illustrating one embodiment of a package structure for an interferometric modulator array.

FIG. 18A is a side-view illustrating an embodiment of a package structure 340 for an interferometric modulator array that can contain the transmissive element 102 depicted in FIG. 17. Similar to the structures described above, the package structure 340 comprises an interferometric modulator array 342 formed on a substantially transparent substrate 344, such as glass, and a backplate cover or "cap" 346 that encloses the array. The package structure 340 can further have a seal 348 formed or applied between facing surfaces of the backplate 346 and the substrate 344. In one embodiment, the primary seal 348 is a non-hermetic seal, such as a conventional epoxy-based adhesive. The various packaging systems described above, as well as other systems, can also be employed. Unlike the packaging systems described above, the device in FIG. 18A further contains an optional heater 350, which can be used, as described in more detail below, to regenerate the protective coating.

Figure 18B:
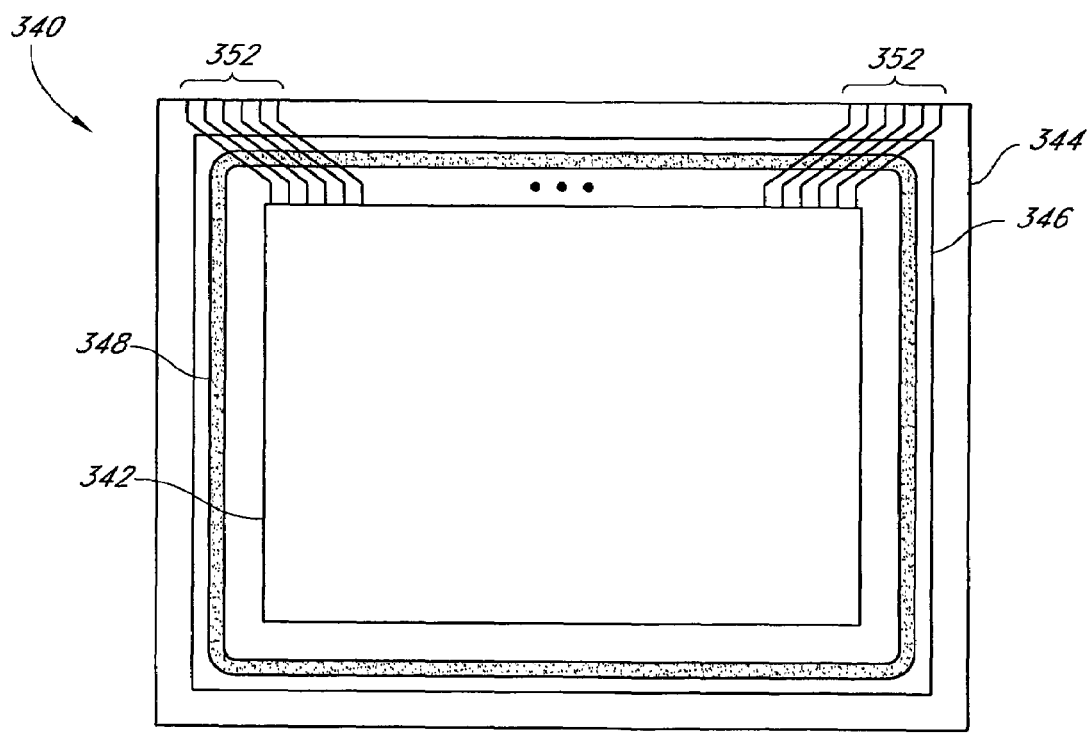
FIG. 18B is a plan-view illustrating the package structure of FIG. 4A.

FIG. 18B is a plan-view illustrating the package structure 340 of FIG. 18A. As illustrated in FIG. 18B, a plurality of conductive leads 352 (partially shown) can be located on the substrate 344 and configured to provide an electrical connection of a driver circuit (not shown) to the elements of the interferometric modulator array 342. The package structure 340 can include conductive leads 352 formed on more than one side of the substrate 344, and the conductive leads are only illustrated on one side of the substrate and in the configuration shown for convenience.

The driver circuit is configured to control operation of the elements of the interferometric modulator array 342. As will be appreciated by one of skill in the art, the conductive leads 352 can be positioned on the substrate 344 in a plurality of configurations and the configuration illustrated is exemplary in nature. In some embodiments the driver circuit is used to control the heater. In other embodiments, a separate device or element is used to control the heater.

Figure 18C:
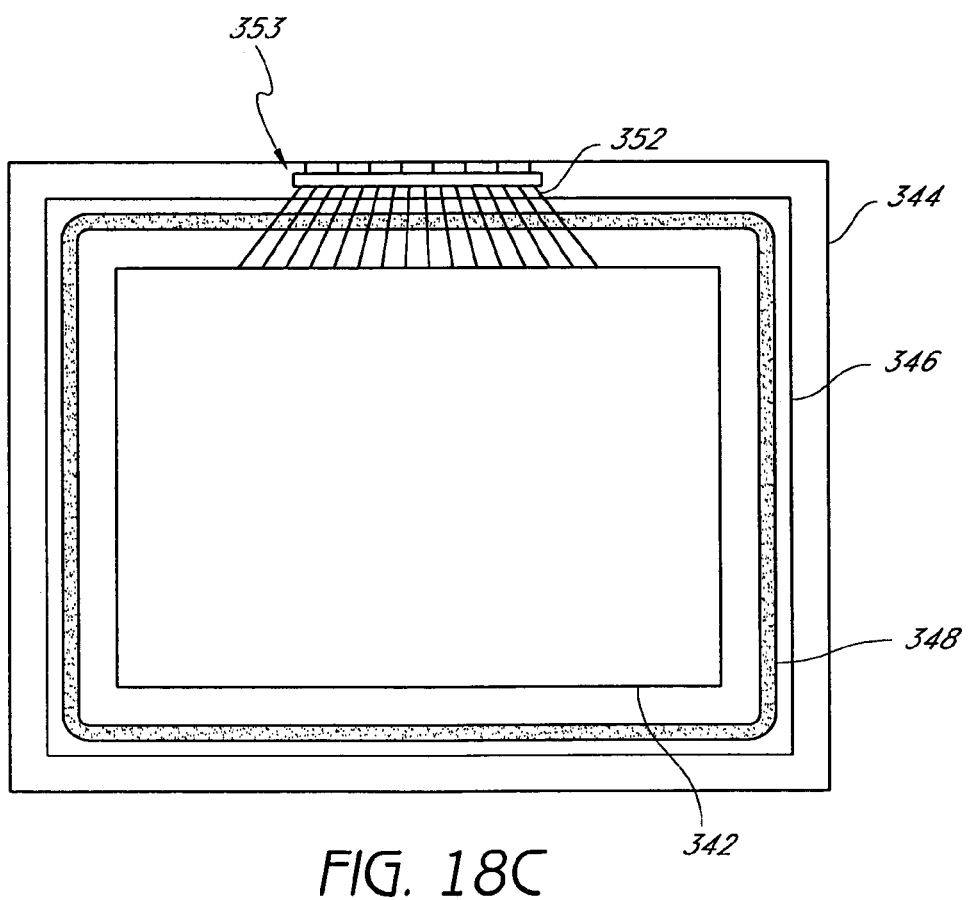
FIG. 18C is a plan-view illustrating an embodiment in which the driver circuit is located on the substrate.

As will be appreciated by one of skill in the art, the driver circuit can be located in various areas of the package. In some embodiments, the driver circuit 353 is located on the substrate, as shown in FIG. 18C. In this embodiment, the driver circuit can readily be used to control the heater, especially if the heater is on the substrate. As will be appreciated by one of skill in the art, in some embodiments, the heater is controlled through a device other than the driver circuit. For example, in embodiments in which the heater or heater leads are off of the substrate, other discrete components can be used to control the heater. For example, a power transistor can be used to control the heater. Given the present disclosure, one of skill in the art will readily be able to identify alternative means for powering or controlling the heater.

While the protective coatings discussed above have many possible advantages, it has been realized that during the operation of the interferometric modulator elements, the protective coating 160, 170, or 908 may be rubbed or chipped off due to repeated contact from the transmissive element and the reflective element. The rubbing or chipping may or may not be uniform over the surface of the coating. The protective coating may flake away from the insulator layer over a period of time. Thus, it can be advantageous to repair this protective coating at various times throughout the life of the device. The following discloses various methods for how the protective coatings can be regenerated.

One embodiment of a method of regenerating or redistributing a protective coating (e.g., self-aligned monolayer) such as the shown protective coatings 908, 170, or 160 comprises elevating the temperature of the protective coating 908, 170, or 160 to a temperature at which the protective coating material changes from a solid to a fluid, a vapor, or has dramatically increased vapor pressure such that the protective coating material is redistributed over the layer it was initially coating in a substantially uniform configuration. This allows the protective coating to be repaired and regenerated, even if it is still contained within a package (e.g., FIGS. 13A, 13B, 18A, or 18B). This can be achieved through various devices. For example, an optional heater 350 can be included in the package, as shown in FIG. 18A.

Figure 18D:
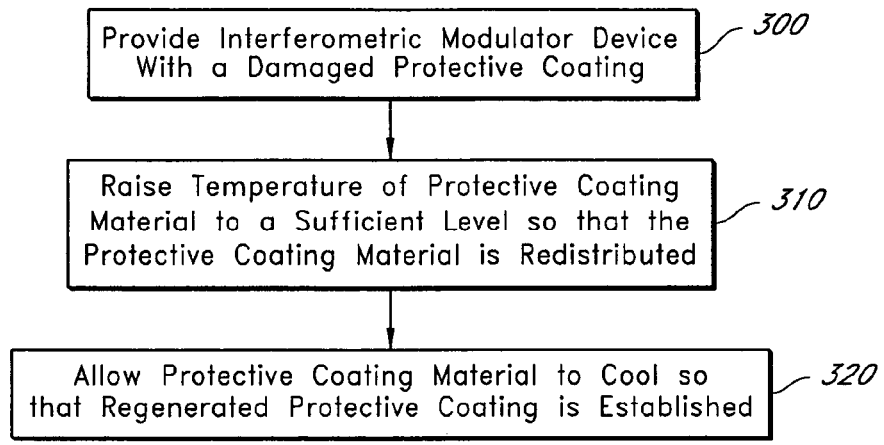
FIG. 18D is a flow chart of one embodiment of a method for regenerating a protective coating.

FIG. 18D depicts one embodiment of the method. First 300, one provides an interferometric modulator device with a protective coating, preferably a coating that has been damaged or is suspected of having been damaged. Next, 310, one raises the temperature of the material of the protective coating so that the protective coating can redistribute itself across a surface. The protective coating material that is heated can either be the material of the protective coating itself (i.e., the coating on the reflective or transmissive elements) or it can be from a reservoir of protective coating material. Once the temperature has been elevated for a period of time to allow for redistribution of the material of the protective coating, the device is allowed to cool 320, which allows the protective coating to be solidified; thus, regenerating the protective coating. As will be appreciated by one of skill in the art, the method depicted in FIG. 18D can be performed after the method depicted in FIGS. 15 and 16 or even during the earlier procedure, if it is helpful in initially establishing a monolayer.

As will be appreciated by one of skill in the art, elevating a temperature in a device can be measured in various ways, for example, at the temperature of the heating element, or the temperature at some point of the device to be heated. When an upper limit of temperature is discussed, it is generally in regard to the temperature of the item to be heated, rather than the heating element itself. One of skill in the art will recognize that the heating element itself can be heated to substantially higher temperatures in some embodiments than can the device generally. In a preferred embodiment, one obtains the desired amount of heat by running a known current for a known time through a particular heater. Given the present disclosure, the current and time can be determined through routine experimentation.

In some aspects, the invention is the use of a material as a protective coating that can allow the regeneration of the protective coating after the device is assembled. Thus, in one embodiment, protective coatings that are solid primarily at relatively low temperatures and exhibit relatively high volatility at elevated temperatures, and thus can be redistributed in a system upon heating, are contemplated. For example, protective coating materials that can redistribute themselves when heated above 22-50, 50-85, 85-100, 100-250, 100-110, 110-120, 120-150, 150-200, 200-225, 225-250° C., or more, can be used to make a device with a protective coating with regenerative capabilities. As will be appreciated by one of skill in the art, protective coatings with higher stability at the lower temperatures can be advantageous for typical working conditions, as the protective coating should maintain a relatively solid form during typical use of the device.

Various protective coatings have been discussed above. In a preferred embodiment, the material for the protective coatings can form a self-assembled monolayer (SAMs). Preferably, the material, while solid under standard operation conditions, is readily melted or vaporized upon the addition of energy, such as heat. Thus, especially preferred are materials that form SAMs, that can be dissociated and regenerated at temperatures, and that will not damage the elements of the interferometric modulator device, the package, and/or the device containing these items. Exemplary materials for the regenerating protective coatings include, for example, self-aligning monolayers, such as polytetrafluoroethylene (PTFE) and octadecyltrichlorosilane (OTS).

Materials further include, for example, a long-chain aliphatic halogenated polar compound, such as a perfluoroalkanoic acid of the general formula $F_3C(CF_2)_xCOOH$, where X is preferably 10 or more (e.g., perfluorodecanoic carboxylic acid), for example 10, 12, 14, 16 or 18. The COOH moiety provides a good "anchor" to the surface of the transmissive or reflective element, while the free end or remainder of each molecule provides low surface energy which discourages sticking of the two elements. The attachment of the COOH moiety can be enhanced by appropriate pretreatment of the surfaces of the reflective or transmissive layers. As discussed herein, these molecules are selected on being able to form a stable protective coating under typical operating conditions, but by being sufficiently volatile when heated so as to allow movement and regeneration of the protective coating. One of skill in the art, given the present disclosure will recognize how to select or modify such a monolayer. For example, the number of carbons in the long chain or the number of double bonds in the long chain can alter the stability of the protective coating created. Additionally, additive can be added to further adjust the melting point of the protective coating.

In some embodiments, multiple types of protective coating materials can be used at once. In some embodiments, an initial protective coating is established that is difficult to regenerate (e.g., Teflon™) and a second type of protective coating material is also added to the device that is readily regenerated. In some embodiments, the second type of protective coating material is selected so that it will preferably bind to any gaps in the Teflon™ coating, thus reestablishing a complete protective coating. In some embodiments, the "underneath" coating can be chosen to adjust other parameters, such as adhesion and temperature dependence.

While the embodiments discussed herein concentrate on methods and compositions that use sources of heat that are internal to a package, in some embodiments the heat or energy source can be located externally to the package 85. Thus, in some embodiments, an external heat source can heat either the entire package or a part of the device (e.g., just the reflective and/or transmissive elements). This can be done in a variety of ways, for example, using radiation, such as a laser, or heating the atmosphere around the device. The heat can be administered through the substrate 344 or e.g., through the backplate 346. The heat can be administered via radiation, conduction, or convection.

Figure 19:
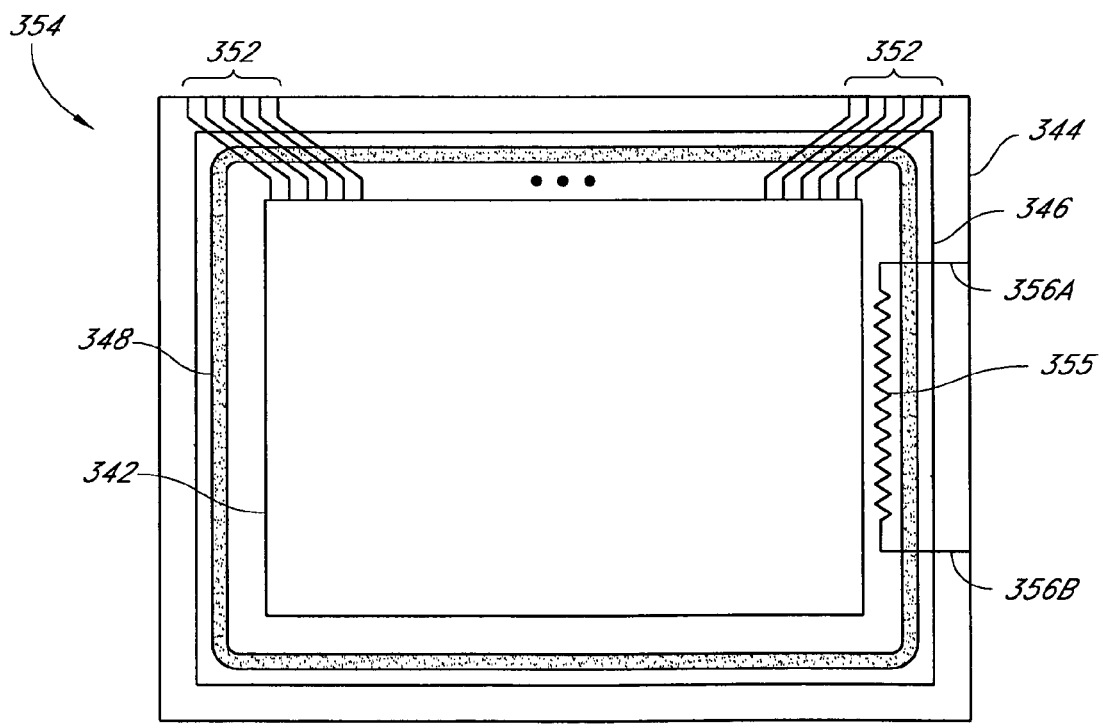
FIG. 19 is a plan-view illustrating one embodiment of a packaged interferometric modulator array including a monolayer regeneration heater element.

FIG. 19 is a plan-view illustrating another embodiment of a system 354 for regenerating a protective coating formed on the surfaces of an interferometric modulator array 342. The system illustrated in FIG. 19 comprises a heater, e.g., a heater element 355 positioned proximal to the interferometric modulator array 342. The heater element 355 can be fabricated by photolithographic patterning of one or more metallic layers deposited during the fabrication of the interferometric modulator structure. The heater element 355 is configured to emit heat in response to current generated by the application of a predefined current at conductive leads 356A and 356B, wherein the amount of heat emitted by the heater element 355 is sufficient to raise the temperature of the protective coating (e.g., self-aligned monolayer) such that the coating is redistributed over the conductor layer.

Application of a current to the conductive leads 356A and 356B can be controlled, for example, by the driver circuit (not shown) which is also configured to control operation of the elements of the interferometric modulator array 342 via conductive leads 352. The driver circuit can be configured to apply a predefined current to the heater element 355 on a fixed periodic basis during the lifetime of the interferometric modulator array 342 when implemented in an electronic device. In other embodiments, application of a predefined voltage is used. As will be appreciated by one of skill in the art, the driver circuit itself can be located on the glass. However, in some embodiments, such as when the heater is not on the glass, the driver circuit does not have to be on the glass. In some embodiments, the driver circuit is not used to control the heater and another source of current/voltage is used.

In one embodiment, the heater element 355 is positioned on the substrate 344. In other embodiments, multiple heater elements can be implemented, for example, proximal to each edge of the interferometric modulator array 342. As will be appreciated by those skilled in the technology, the configuration of the heater element 355 is not limited to that shown or described, and additional configurations are contemplated. The actual configuration and placement of the heaters will vary depending upon the desired application, and one of skill in the art, in light of the present disclosure, will be able to determine the appropriate placement and configuration. For example, the amount of space available, the proximity of the heating element to other heat sensitive devices, the level of heat required to substantially vaporize or regenerate the protective coating, the volatility of the protective coating material to heat, the composition and resistance of the heating element, and the composition of the substrate, to name a few factors.

The term "heater," "heater device", "heater element," and other similar terms are interchangeable, where appropriate. Generally, "heater element" denotes the actual substance that is heated by electrical current or other means, while the heater can denote a more general concept of either an entire heating device or the element itself.

In another embodiment, the heater is not located on the substrate but elsewhere in the package. For example, the heater can be located on the backplate or cap 346. For example, in one embodiment, item 350 in FIG. 18A is a heater; thus, the heater can be attached to the backplate in some embodiments.

As will be appreciated by one of skill in the art, the amount of heat required and duration of the application of the heat can be determined in a variety of ways. For example, in a given package, containing a damaged protective coating (which can be damaged on purpose for the purpose of testing) an amount of heat is applied to the device and the device allowed to cool. Following this, the surface and conformity of the protective coating can be examined, either functionally, or directly, e.g., via a microscope. This process can be repeated, either in the same or different devices, to determine the duration and amount of current required to generate enough heat for a particular heater in a particular package to sufficiently regenerate a protective coating. Various amounts of regeneration are contemplated, for example 1-10, 10-20, 20-30, 30-40, 40-50, 50-60, 60-70, 70-80, 80-90, 90-99, and 99-100 percent regeneration of the surface returned to its original covered state. In some embodiments, a maximal current for a maximal duration is used. In a preferred embodiment, data from the above can be used to create a heating protocol where a predetermined current is run through the heating device for a predetermined time to regenerate the layer. In a preferred embodiment, no verification of the integrity of the layer is required.

In some embodiments, it can be useful to have an additional reservoir of the material of the protective coating available in the package. This can be particularly useful in situations where the protective coating is a monolayer. In some embodiments, both the exposed surface of the reflective layer and the exposed surface of the transmissive layer are coated with the protective coating. In some embodiments, there is a reservoir of the protective coating material in the package, which is in addition to the amount that is already on either or both of the transmissive and reflective layers. In some embodiments the reservoir is more than a monolayer thick. The reservoir can be distributed throughout the package so that excess protective coating material is available throughout the package and surrounding the interferometric modulator device array. The reservoir can be positioned on top of or near the heating element. Thus, in some embodiments, a very low level of heat is all that needs to be applied in order to have the protective coating material of the reservoir capable of redistributing itself. In some embodiments, the reservoir is simply the presence of more protective coating material than is required to coat one surface of either the transmissive or reflective layers.

As will be appreciated by one of skill in the art, in embodiments that use a reservoir, any structure in the package or interferometric modulator device can be used as a surface for adding a reservoir of the packaging material, including various posts, supports, and packaging surfaces. As will be appreciated by one of skill in the art, the addition of the protective coating by wafting it into the package or across an interferometric modulator device can naturally result in excess protective coating material in the package or on the interferometric modulator device, thus establishing a reservoir. In embodiments in which the protective coating has been added through wafting of the protective coating material though a hole in the package, the protective coating material can be located throughout the various surfaces of the package. In embodiments in which the protective coating is wafted onto the interferometric modulator device before the device is enclosed within the package, only the interferometric modulator device can be coated with the protective coating. As will be appreciated by one of skill in the art, not every type of protective coating may adhere to every surface available. The type of protective coating material can be selected based on the previously mentioned characteristics, as well as where and how much of the protective coating is desired in the final device. In some embodiments, additional protective material is added to the device after it has been used. In some embodiments, the establishment of the protective coating is done before the first use of the device for its intended purpose. In other embodiments, the heating or heaters described herein is employed when the protective coating is first established, to help establish a uniform coating of the protective coating.

In some embodiments, the regenerative components and methods are used with an interferometric modulator device with a getter or desiccant. As will be appreciated by one of skill in the art, the temperature of the getter generally should not be raised to the point that water that has been absorbed is lost. This can be achieved by thermally isolating the getter from the heater system, or maintaining the temperature of the heater beneath a certain temperature. In some embodiments, a desiccant or getter is not employed when a heater is employed.

In some embodiments, only one protective coating is required between the transmissive and reflective layers. Thus, when more than one surface area is covered, the additional material can be considered a reservoir. As will be appreciated by one of skill in the art, where the reservoir is the complementary layer, heating of the device may result in movement of protective coating from one layer to the other layer. It is permissible that one layer loose protective coating so that the other layer is able to regenerate its protective coating.

As will be appreciated by one of skill in the art, in some embodiments, the protective coating is not "completely" regenerated. Rather, in some embodiments, the section of the coating that has been damaged is regenerated while another section of the coating is exposed. This can occur without detrimental impact to the operation of the device when the section from which the protective coating material is taken is from a part of the layer that does not contact the other layer. This could include, for example, the section of the portion of the reflective layer 14b that is located between the supports 18 and where the reflective layer 14b contacts the transmissive layer 16b. One of skill in the art will appreciate that, to some extent, such a repositioning of the material of the protective coating will occur due to the fact that the location of the damage to the protective coating will be, for example, where contact occurs between the two layers, thus creating a relatively low concentration of the material there, and redistribution of the protective coating, while random, will result in an increase in protective coating material at the damaged site and a reduced concentration at the undamaged site. This can be readily achieved by using self assembled monolayers, the molecules of which will redistribute themselves across a layer. Thus, in some embodiments, only the contact zone (the area of one element that contacts the other element) of the protective coating is regenerated or partially regenerated.

Figure 20A:
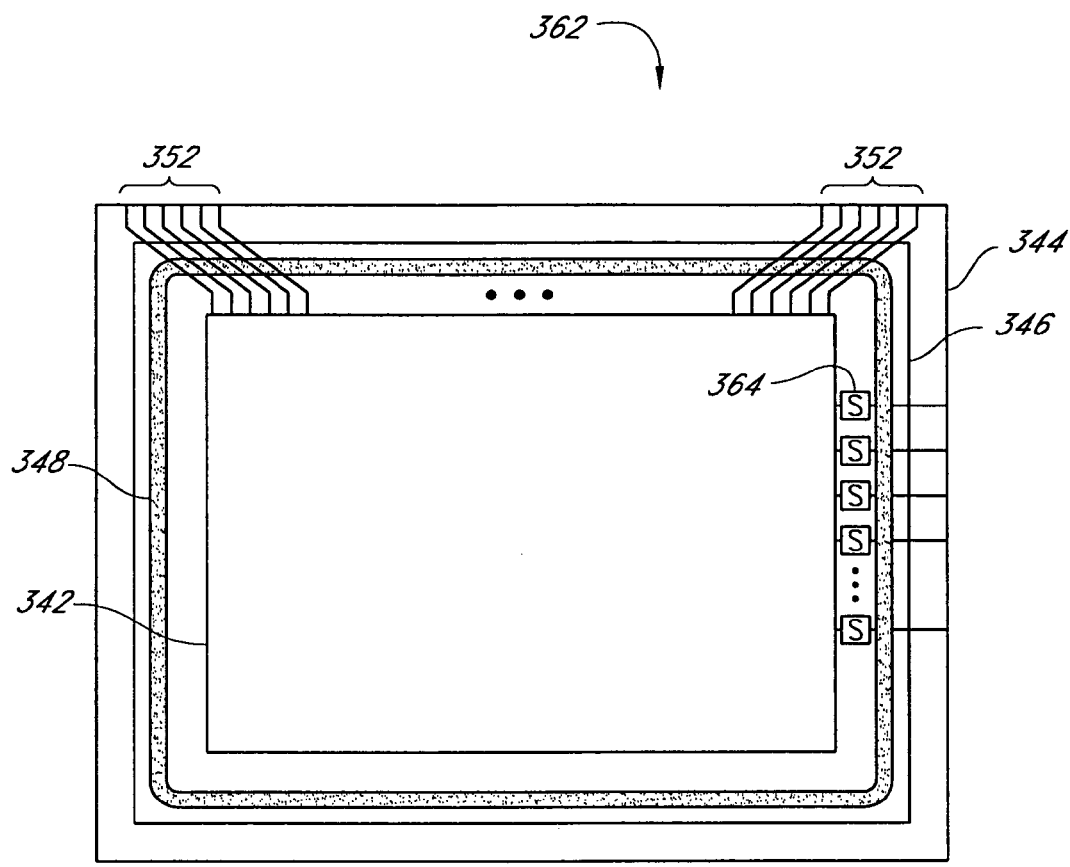
FIG. 20A is a plan-view illustrating one embodiment of a system for regenerating a monolayer formed on a conductor surface of an interferometric modulator array.

Another embodiment of the system 362 for regenerating the protective coating of the interferometric modulator array 342 is shown in FIG. 20A. In this embodiment, there are conductive leads 352 that can be repurposed so as to emit heat sufficient to redistribute the protective coating in response to application of a predefined voltage. In one embodiment, an element or layer already in the interferometric modulator device is repurposed as a heater.

Typically, the conductive leads extend from the driver circuit, through the interferometric modulator array, and terminate open-ended at the far-side of the array. In some embodiments, a plurality of these conductive leads can be routed back, or "looped" to the driver circuit around the periphery of the array. During normal operation, the looped leads are isolated from ground potential by transistor switches (for example) inside the driver circuit. When redistribution of the protective coating is desired, the transistor switches are activated to short the looped leads to ground potential, and the application of a predefined current or voltage will cause one or more of the looped leads to emit sufficient heat to redistribute the protective coating of the interferometric modulator array 342. In some embodiments, a current limiting resistor is in the loop between the lead and ground.

In one embodiment, the heat generating current is looped through the transmissive layer. In a preferred embodiment, the heat generating current is looped through a circuit that has a relatively high resistance so that a desired amount of heat can be generated. As mentioned above, the transmissive layer can comprise a relatively high resistance material, such as chrome. In embodiments in which the protective coating is attached to the transmissive layer, either directly or indirectly, this can be advantageous, as heat will be generated on the surface that requires additional or redistribution of the protective material of the coating. In another embodiment, the heat generating current is looped through another conductive layer that has a relatively high resistance (such as a layer having chrome or nickel in it), such as a mechanical layer (or moveable layer) 34 in the device.

As will be appreciated by one of skill in the art, in some embodiments, any substance or part of the interferometric modulator device or package that will emit heat when a current is run through it can be used. As will be appreciated by one of skill in the art, the interferometric modulator device need not be operational during the regeneration step, therefore even devices or elements that might normally be required for the operation of the interferometric modulator device can be used as heaters. As will be appreciated by one of skill in the art, it can be desirable for there to be a relatively large amount of space above the surface that is to be repaired, as it can allow a more efficient regenerative process to occur. Thus, in some embodiments, the reflective and transmissive elements are positioned relatively far away from one another during the regenerative process.

Figure 20B:
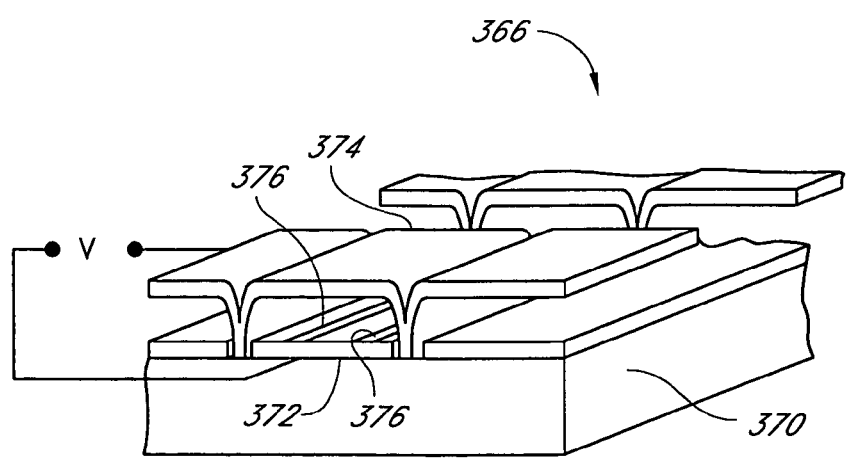
FIG. 20B is a perspective-view illustrating one embodiment of a MEMS switch for use in the system of FIG. 20A.

In some embodiments, the isolation switches for the above embodiment can be implemented on the substrate as MEMS switches 364 as illustrated in FIG. 20A, wherein the MEMS switches are coupled to a common ground connection in the driver or else-where. FIG. 20B is a perspective-view illustrating an exemplary MEMS switch 366. The MEMS switch 366 comprises a substrate 370 having a primary conductor layer 372 formed thereon. An insulator layer can be formed on the primary conductor layer 372. However, the insulator layer is not illustrated in FIG. 20B for convenience, and reference to the primary conductor layer 372 should be understood to comprising the combination of the conductor layer 372 and an insulator layer formed thereon.

The MEMS switch 366 further comprises a secondary conductor layer 374 which is configured to deform toward the primary conductor layer 372 in response to application of a voltage, similar to the reflective layer (or conductor layer) 14*b* illustrated in FIG. 1. The MEMS switch 366 can be fabricated, for example, as described in detail in U.S. Pat. No. 5,835,255 in reference to FIGS. 26A-K. The MEMS switch 366 also includes one or more switch conductors 376 formed on the primary conductor layer 372. During operation, the secondary conductor layer 374 deforms toward primary conductor layer 372 in response to application of a voltage V (see FIG. 1, for example). When the secondary conductor layer 374 contacts the switch conductors 376, the MEMS switch 366 allows current to flow between conductors 376. Thus, the MEMS switch 366 can be actuated in response application of a predefined voltage to the primary and secondary conductors 372 and 374.

In some embodiments, the heater or heater element is positioned relatively close to the reflective layer. This can be achieved in a variety of ways. For example, as discussed above, a heater can be located on the backplate of a package.

Figure 21A:
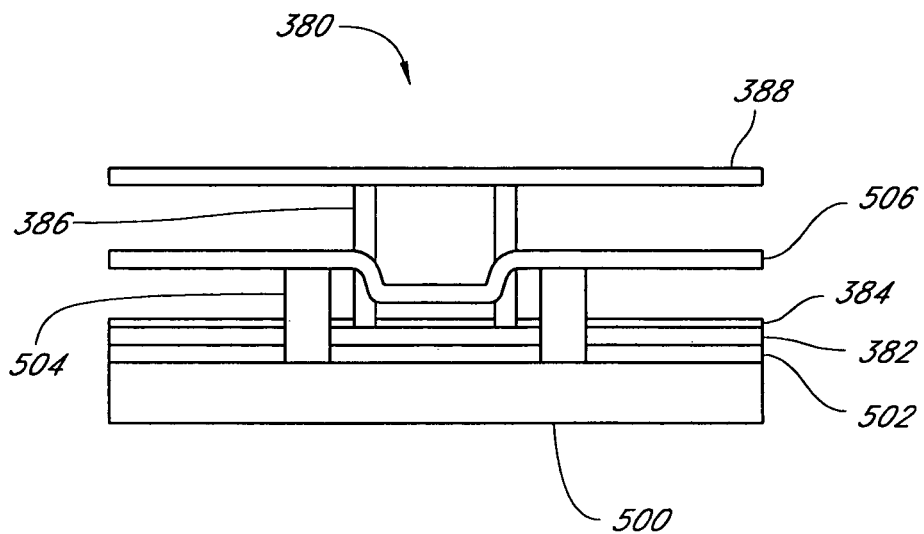
FIG. 21A is a side-view illustrating another embodiment of a system for regenerating a monolayer formed on a conductor surface of an interferometric modulator array.

FIG. 21A is another embodiment in which the heater is placed relatively close to the reflective layer. FIG. 21A is a side-view illustration of another embodiment of a system 380 for regenerating a self-aligning monolayer for an interferometric modulator array. Similar to the interferometric modulator elements illustrated in FIG. 1, the system 380 comprises a transmissive layer 502 formed on the substrate 500, and a reflective layer 506 supported by the insulating supports 504. An insulator layer 382, similar to insulator layer 904 (FIG. 17), is formed on the transmissive layer 502, and a protective coating, such as a self-aligning monolayer, 384 is also present (similar to the protective coating 908 in FIG. 17), having been formed on the insulator layer 382. In certain embodiments, the protective coating is distributed over a plurality of surfaces and is not limited to formation on top of the insulation layer 382.

Figure 21B:
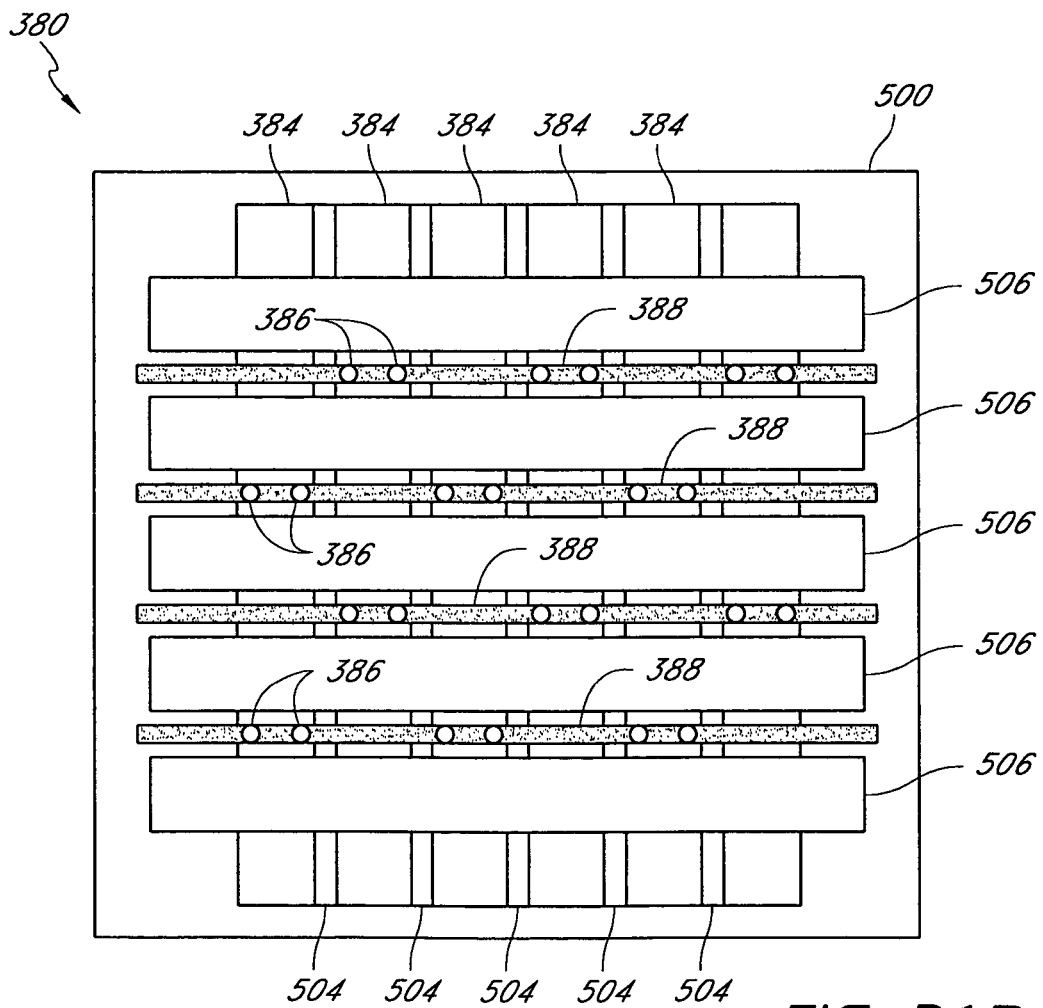
FIG. 21B is a plan-view illustrating the heater grid system of FIG. 21A. In another embodiment.

As illustrated in FIG. 21A, the system 380 can further comprise one or more posts 386 formed on the insulator layer 382 between adjacent reflective layers 506 (see FIG. 21B). The posts 386 extend away from the insulator layer 382 and can extend beyond the height of the reflective layer 506. The posts 386 are configured to support a heater grid 388 or individual heating elements. The heater grid 388 is configured to emit heat in response to a predefined voltage or current. The emitted heat is sufficient to raise the temperature of the protective coating such that the protective coating or additional protective coating is redistributed substantially uniformly over the insulator layer 382 or whichever layer the protective coating is covering. In one embodiment, the protective coating is redistributed without heating the layer 384 to any great extent. For example, an additional amount of protective coating material can be located on the heater grid; and thus, only the heater grid need be heated to any significant degree.

FIG. 21B is a plan-view illustration of the system 380 of FIG. 21A. The tops of the posts 386 are shown for illustration purposes only. The substrate 500 can include conductive leads (not shown) for connection between the heater grid 388 and a driver circuit (not shown) for the interferometric modulator array. The driver circuit is configured to control application of a current or voltage to the heater grid 388, thereby controlling the regeneration of the protective coating 384. As will be appreciated by one of skill in the art, the current need not be provided by the driver IC, and other sources of voltage/current can be used for these heaters. When the heater leads are off of the glass, one can readily supply voltage/current through alternative voltage/current sources.

As will be appreciated by one of skill in the art, in light of the present disclosure, the heater or heater grid 388, can be positioned at various levels. For example, while the heater grid 388 is shown above the reflective layer or element 506, it can also be positioned in the same plane as the reflective layer or element, beneath, or partially beneath the reflective layer or element 506. Additionally, the position of the protective coating can be varied or a protective coating can be applied throughout the entire interferometric modulator device or the entire package. As will be appreciated by one of skill in the art, positioning the protective coating on the reflective layer 506, which is closer to the heater grid 388 in this embodiment, can allow for a lower amount of heat from the heater grid to be sufficient to redistribute the protective coating across the layer.

In some embodiments, the various embodiments described above are combined. For example, in some embodiments, multiple types of heaters are combined, or multiple methods of heating and regenerating the device are performed simultaneously. For example, an external source of heat can be applied at the same time an internal heater is being used, which may allow for a higher efficiency of regeneration to occur.

Figure 22:
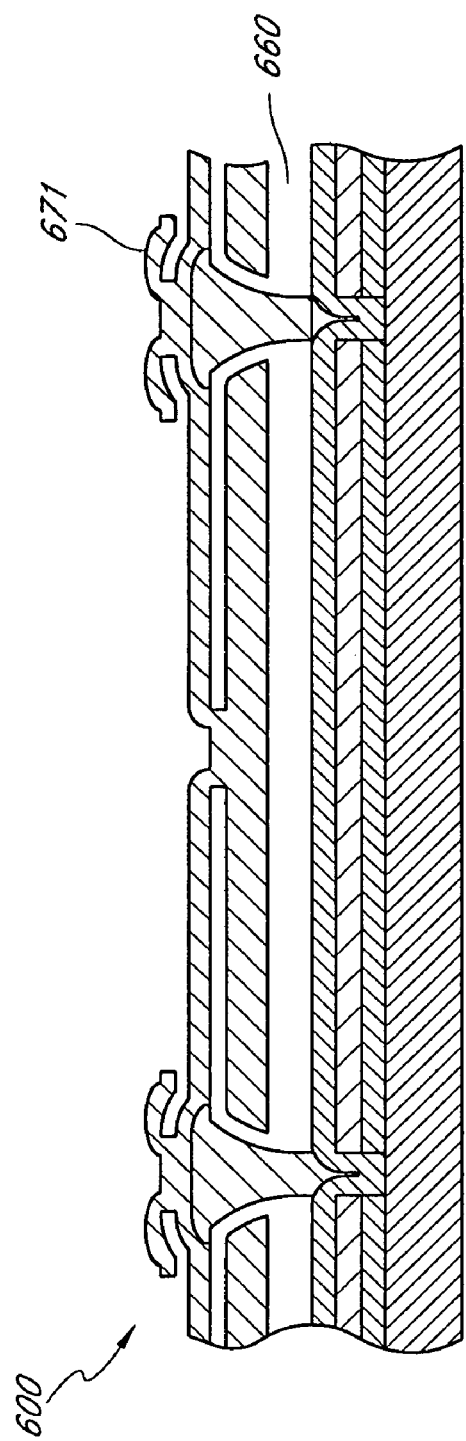
FIG. 22 is a side-view illustrating a bus structure on an interferometric modulator device that can be repurposed as a heater.

In some embodiments, a bus system, which is positioned above the reflective element, similar to what is shown in FIG. 22, can be repurposed for heating of the protective coating. In this embodiment, the interferometric modulator device 600 is similar to other interferometric modulator devices (it has a cavity 660 and reflective and transmissive layers), but it further has a bus structure 671 that is located on top of the supports. The bus structure can be repurposed as described above (e.g., particular MEMS switches or transistors). One advantage of this structure is that the heater or heating element takes up no additional space from the interferometric modulator device; thus, there is no loss in resolution of the device. Additionally, as the bus structure 671 is located on top of the supports for the reflective layer, additional supports do not need to be added to the device to support the heater. A detailed description of a bus structure and how to make it is disclosed in U.S. patent application Ser. No: 10/644,312, filed Aug. 19, 2003 now published U.S. Patent Publication U.S. Pat. No. 2004/0051929.

The foregoing description details certain embodiments of the invention. It will be appreciated, however, that no matter how detailed the foregoing appears in text, the invention can be practiced in many ways. It should also be noted that the use of particular terminology when describing certain features or aspects of the invention should not be taken to imply that the terminology is being redefined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

The invention claimed is:

1. An interferometric light modulating device, comprising:
    a transparent substrate;
    an interferometric modulator array disposed on said transparent substrate, wherein said array comprises a transmissive layer and a reflective layer;
    a protective coating disposed between at least a portion of said transmissive layer and said reflective layer; and
    a heater configured to increase the temperature of said protective coating.

2. The device of claim 1, wherein said transparent substrate is sealed to a backplate to form a package, and wherein said interferometric modulator array is located within said package.

3. The device of claim 2, wherein said protective coating comprises a self-aligning monolayer.

4. The device of claim 3, wherein said self-aligning monolayer comprises one of the following: polytetrafluoroethylene (PTFE), perfluorodecanoic carboxylic acid, octadecyltrichlorosilane (OTS), or dichlorodimethylsilane.

5. The device of claim 3, further comprising at least one hole in said package.

6. The device of claim 1, further comprising a reservoir of a protective coating material that is not on the transmissive layer or the reflective layer, wherein said reservoir of said protective coating material can serve as a source for additional protective coating in the package during a regeneration procedure.

7. The device of claim 1, wherein said protective coating is provided on at least a portion of said transmissive layer.

8. The device of claim 1, wherein said protective coating is provided on at least a portion of said reflective layer.

9. The interferometric light modulating device of claim 1, wherein said interferometric light modulating device is a display system comprising:
    an electronic display comprising said interferometric light modulating array;
    a processor that is in electrical communication with said interferometric light modulating array, wherein said processor is configured to process image data; and
    a memory device in electrical communication with said processor.

10. The display system as recited in claim 9, further comprising:
    a first controller configured to send at least one signal to said display; and
    a second controller configured to send at least a portion of said image data to said first controller.

11. The display system as recited in claim 9, further comprising:
    an image source module configured to send said image data to said processor.

12. The display system as recited in claim 11, wherein said image source module comprises at least one of a receiver, transceiver, and transmitter.

13. The display system as recited in claim 9, further comprising:
    an input device configured to receive input data and to communicate said input data to said processor.

14. The device of claim 2, wherein the heater is contained within the package.

15. The device of claim 14, wherein the heater comprises a metal layer on a surface within the package.

16. The device of claim 15, wherein the metal layer is part of a circuit that is dedicated to create heat.

17. The device of claim 16, wherein the metal in the metal layer comprises chrome or nickel.

18. The device of claim 14, wherein said heater comprises a looped lead involving the transmissive layer, wherein the looped lead is shorted to ground potential.

19. The device of claim 18, wherein the looped lead is configured to be switchably shorted to ground potential.

20. The device of claim 19, wherein a micro-electro-mechanical-system (MEMS) is used to make the looped lead switchable.

21. The device of claim 14, wherein said heater comprises a looped lead involving a mechanical layer that is associated with the reflective layer, wherein the looped lead is shorted to ground potential.

22. The device of claim 21 further comprising a current limiting resistor between a lead and a ground.

23. The device of claim 14, wherein the heating element is positioned on a post in the package.

24. The device of claim 23, wherein the heater is in about a same plane as that of the reflective layer in an undriven state.

25. The device of claim 23, wherein the heater on the post is positioned above the reflective layer and above the substrate.

26. The device of claim 14, wherein the heater is a bus structure that is positioned on top of a support and above a reflective layer.

27. A system for regenerating a self-aligned monolayer formed on one or more layers of a micro-electronic-mechanical-system (MEMS) device, comprising:

a MEMS device comprising a transmissive layer, a reflective layer, and a self-aligned monolayer; and a heater positioned proximal to the MEMS device, wherein the heat emitted from said heater is sufficient to elevate the temperature of a self-aligned monolayer.

28. A method of regenerating a monolayer in a MEMS device, comprising:

providing a MEMS device comprising an interferometric modulator and a heater, wherein said interferometric modulator comprises a monolayer; and activating said heater in order to increase the temperature of said monolayer, whereby said monolayer is regenerated.

29. A system for regenerating a protective coating on an interferometric modulator device, comprising:

an interferometric modulator device comprising a means for selectively allowing certain wavelengths of light to pass through a first layer, a means for selectively reflecting certain wavelengths of light, and a protective coating; and a means for heating the protective coating.

30. An interferometric modulator device with a protective coating, wherein said protective coating was regenerated on either a transmissive layer or a reflective layer of the interferometric modulator device at least once.

31. A method of making a system for regenerating a self-aligned monolayer formed on one or more layers of a micro-electronic-mechanical-system (MEMS) device, comprising:

providing a MEMS device comprising a transmissive layer, a reflective layer, and a self-aligned monolayer; and positioning a heater proximal to the MEMS device, wherein the heater is positioned so that heat emitted from said heater is sufficient to elevate the temperature of a self-aligned monolayer.

* * * * *